(12) United States Patent
Lin et al.

(10) Patent No.: US 10,998,315 B2
(45) Date of Patent: May 4, 2021

(54) METAL GATE MODULATION TO IMPROVE KINK EFFECT

(71) Applicant: Taiwan Semiconductor Manufacturing Co., Ltd., Hsin-Chu (TW)

(72) Inventors: Meng-Han Lin, Hsinchu (TW); Te-Hsin Chiu, Miaoli County (TW); Wei Cheng Wu, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/887,138

(22) Filed: May 29, 2020

(65) Prior Publication Data

US 2020/0295001 A1    Sep. 17, 2020

Related U.S. Application Data

(63) Continuation of application No. 16/574,205, filed on Sep. 18, 2019, now Pat. No. 10,741,555, which is a
(Continued)

(51) Int. Cl.
*H01L 29/00* (2006.01)
*H01L 27/092* (2006.01)
(Continued)

(52) U.S. Cl.
CPC .... *H01L 27/0921* (2013.01); *H01L 21/28105* (2013.01); *H01L 21/28123* (2013.01);
(Continued)

(58) Field of Classification Search
None
See application file for complete search history.

(56) References Cited

U.S. PATENT DOCUMENTS 6,153,478 A    11/2000  Lin et al.
6,541,351 B1    4/2003  Bartlau et al.
(Continued)

FOREIGN PATENT DOCUMENTS

JP    2011071431 A    4/2011
KR    20080003556 A    1/2008
KR    20150122295 A    11/2015

OTHER PUBLICATIONS

U.S. Appl. No. 16/217,405, filed Dec. 12, 2018.
(Continued)

*Primary Examiner* — Reema Patel
(74) *Attorney, Agent, or Firm* — Eschweiler & Potashnik, LLC

(57) ABSTRACT

The present disclosure relates to an integrated chip. The integrated chip includes a source region and a drain region disposed within an upper surface of a substrate. One or more dielectric materials are disposed within a trench within the substrate. The trench surrounds the source region and the drain region. A gate structure is disposed over the substrate between the source region and the drain region. The gate structure includes a first gate metal having a first sidewall and a second gate metal having a first outer sidewall that contacts the first sidewall directly over the upper surface of the substrate.

20 Claims, 18 Drawing Sheets

Related U.S. Application Data continuation of application No. 15/989,648, filed on May 25, 2018, now Pat. No. 10,468,410.

(60) Provisional application No. 62/586,346, filed on Nov. 15, 2017.

(51) Int. Cl.

| | | |
|---|---|---|
| *H01L 29/49* | (2006.01) | |
| *H01L 29/423* | (2006.01) | |
| *H01L 29/78* | (2006.01) | |
| *H01L 21/8238* | (2006.01) | |
| *H01L 29/66* | (2006.01) | |
| *H01L 21/28* | (2006.01) | |
| *H01L 21/762* | (2006.01) | |
| *H01L 29/40* | (2006.01) | |
| *H01L 29/51* | (2006.01) | |

(52) U.S. Cl.
CPC .. *H01L 21/76224* (2013.01); *H01L 21/82385* (2013.01); *H01L 21/823842* (2013.01); *H01L 21/823878* (2013.01); *H01L 27/092* (2013.01); *H01L 29/401* (2013.01); *H01L 29/4238* (2013.01); *H01L 29/42376* (2013.01); *H01L 29/4983* (2013.01); *H01L 29/6659* (2013.01); *H01L 29/66545* (2013.01); *H01L 29/66568* (2013.01); *H01L 29/7834* (2013.01); *H01L 29/513* (2013.01); *H01L 29/665* (2013.01)

(56) References Cited

U.S. PATENT DOCUMENTS

| | | | |
|---|---|---|---|
| 7,304,354 | B2 | 12/2007 | Morris |
| 7,514,940 | B1 | 4/2009 | Bu |
| 7,932,143 | B1 | 4/2011 | Pal et al. |
| 8,106,465 | B2 | 1/2012 | Tanaka |
| 9,502,416 | B1* | 11/2016 | Kim ............... H01L 21/28185 |
| 9,627,510 | B1* | 4/2017 | Jagannathan ..... H01L 29/66545 |
| 10,468,410 | B2 | 11/2019 | Lin et al. |
| 2004/0126990 | A1 | 7/2004 | Ohta |
| 2007/0075351 | A1 | 4/2007 | Schulz et al. |
| 2008/0124872 | A1 | 5/2008 | Verma et al. |
| 2009/0140334 | A1 | 6/2009 | Chang |
| 2009/0181477 | A1 | 7/2009 | King |
| 2010/0084717 | A1 | 4/2010 | Tanaka |
| 2011/0042750 | A1* | 2/2011 | Chuang ............ H01L 29/42376 257/368 |
| 2011/0095341 | A1 | 4/2011 | Pal et al. |
| 2011/0198699 | A1 | 8/2011 | Hung et al. |
| 2011/0309417 | A1 | 12/2011 | Wang et al. |
| 2012/0001271 | A1 | 1/2012 | Chae et al. |
| 2012/0292665 | A1 | 11/2012 | Marino et al. |
| 2014/0001529 | A1* | 1/2014 | Hsieh ............... H01L 21/76232 257/314 |
| 2014/0167177 | A1 | 6/2014 | Kim et al. |
| 2015/0243786 | A1* | 8/2015 | Goto ................. H01L 29/7391 257/401 |
| 2016/0190305 | A1 | 6/2016 | JangJian et al. |
| 2017/0170278 | A1 | 6/2017 | Peng et al. |
| 2018/0190773 | A1 | 7/2018 | Huang |
| 2018/0358453 | A1* | 12/2018 | Huang ............. H01L 29/66742 |
| 2019/0148507 | A1 | 5/2019 | Lin et al. |
| 2019/0378905 | A1 | 12/2019 | Lin et al. |

OTHER PUBLICATIONS

Sachin, et al. "Conquering the 'Kink' in Sub-Threshold Power MOSFET Behavior: A Simple Compact Modeling Approach." EDN Network, Jan. 6, 2015.

Hollauer, C.H. "Modeling of Thermal Oxidation and Stress Effects: 1.2—Isolation Techniques." Institute for Microelectronics. The date of publication is unknown. Retrieved online on Oct. 16, 2017 from http://www.iue.tuwien.ac.at/phd/hollauer/node7.html.

Evans, David, "Microelectronic Device Fabrication I, Lecture 5: The Effect of Electric Field on the Semiconductor Surface." Portland State University. The date of publication is unknown, retrieved online on Nov. 14, 2017 from http://web.pdx.edu/~davide/notes.pdf.

Anonymous Author. "2. The Threshold Voltage." Apr. 9, 2018. retrieved from https://nanopdf.com/downloaded/2-threshold-voltage_pdf#.

Non Final Office Action dated Mar. 28, 2019 in connection with U.S. Appl. No. 15/989,606.

Non-Final Office Action dated Mar. 21, 2019 for U.S. Appl. No. 15/989,648.

Notice of Allowance dated Jun. 24, 2019 for U.S. Appl. No. 15/949,648.

Notice of Allowance dated Sep. 25, 2019 in connection with U.S. Appl. No. 15/989,606.

Non Final Office Action dated Jan. 23, 2020 in connection with U.S. Appl. No. 16/217,405.

Non Final Office Action dated Mar. 4, 2020 in connection with U.S. Appl. No. 16/550,497.

Non-Final office Action dated Apr. 30, 2020 in connection with U.S. Appl. No. 16/661,108.

Non-Final Office Action dated Dec. 11, 2019 for U.S. Appl. No. 16/574,205.

Notice of Allowance dated Mar. 24, 2020 for U.S. Appl. No. 16/574,205.

* cited by examiner

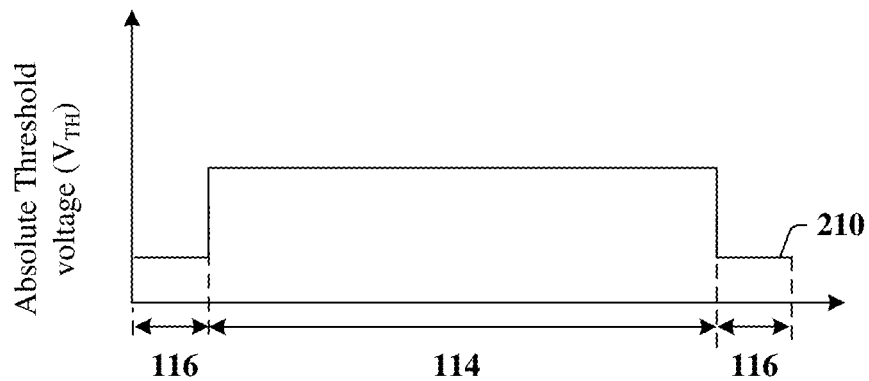
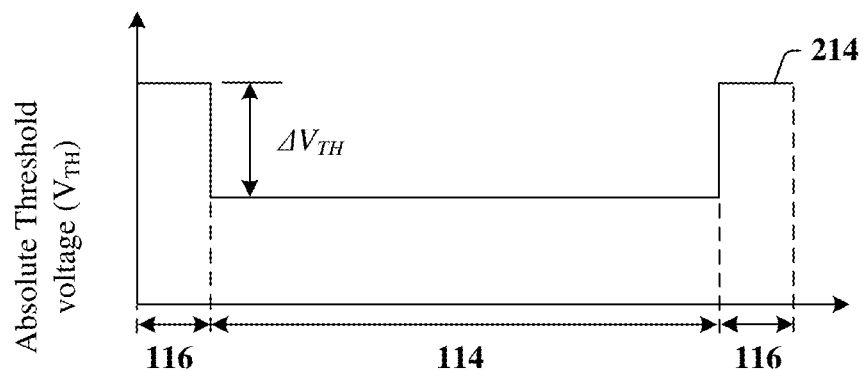
Fig. 2C

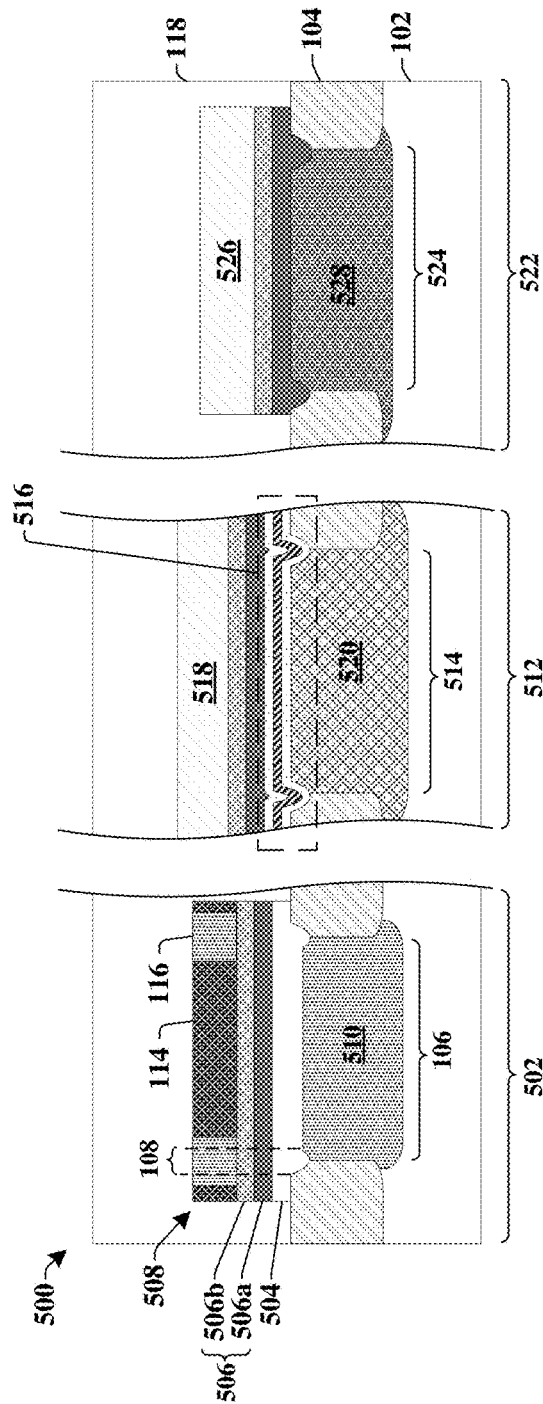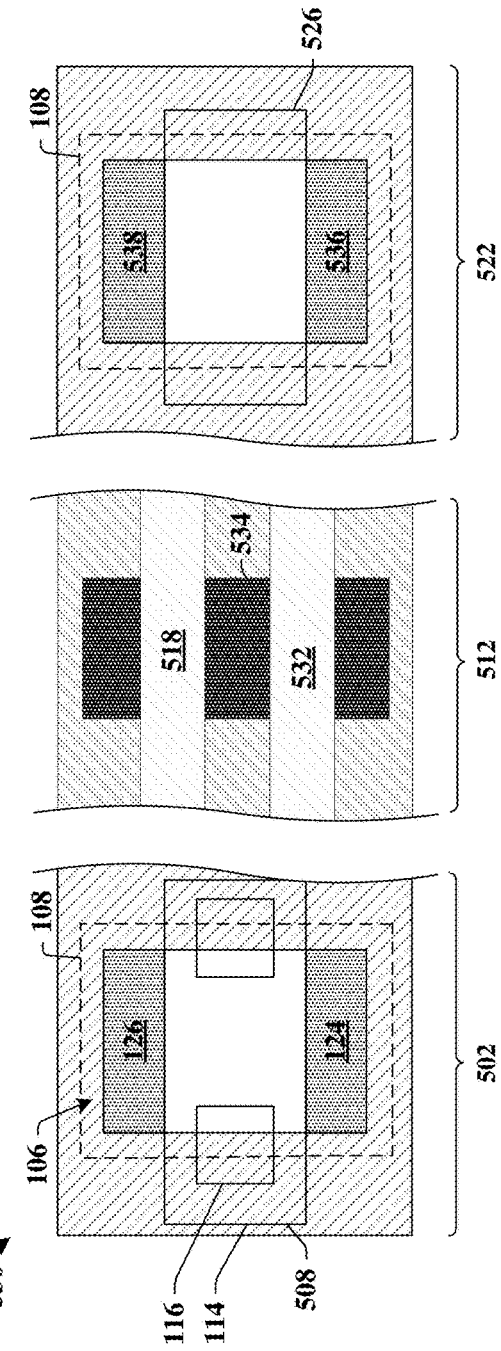
Fig. 5A
Fig. 5B

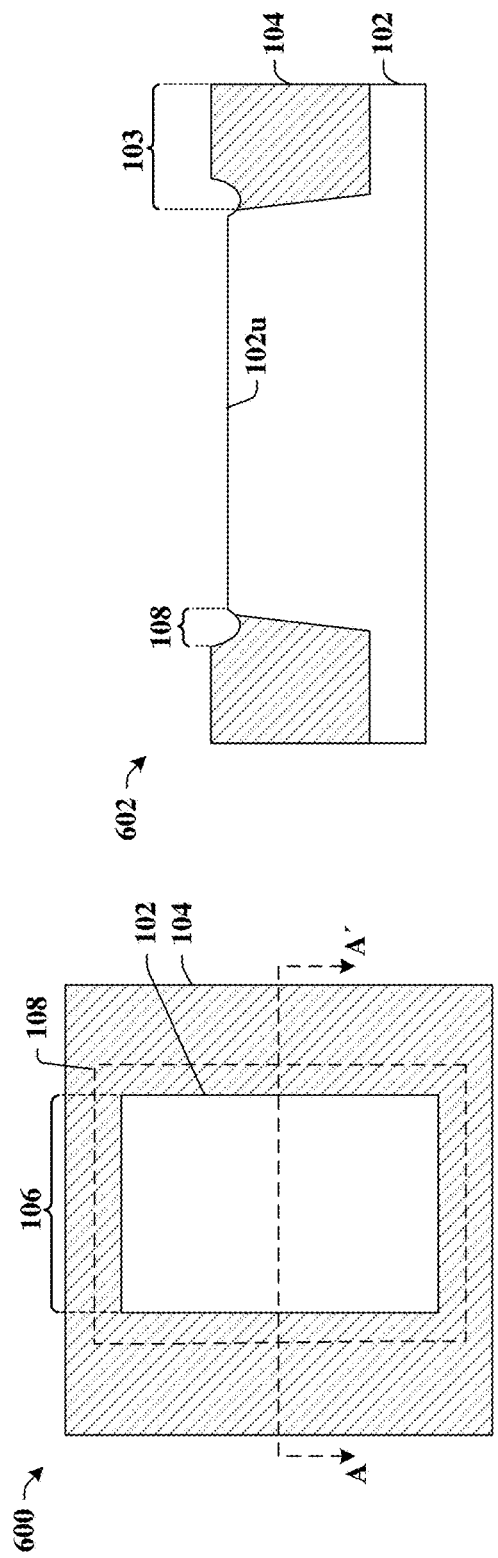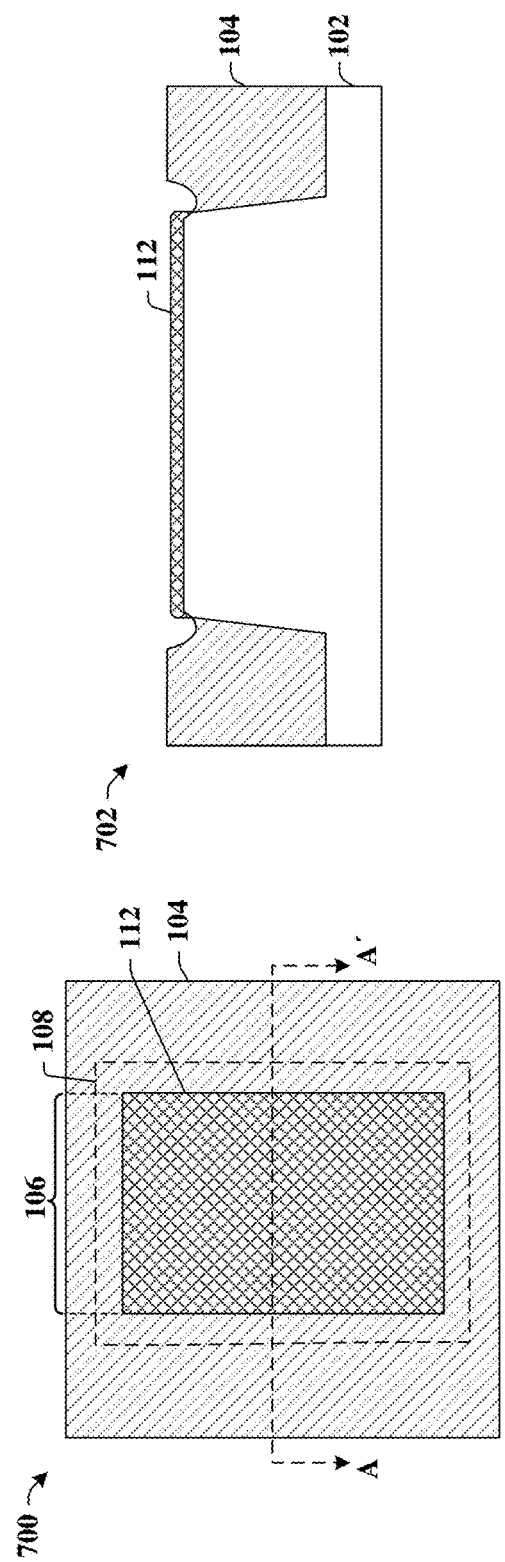

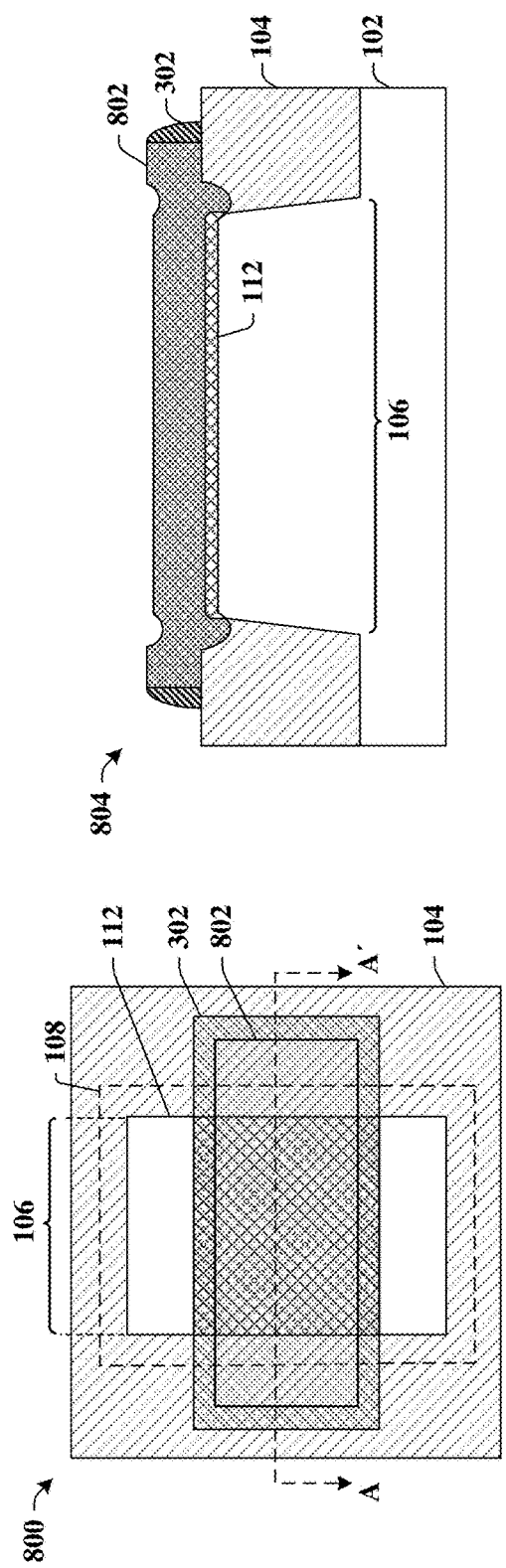
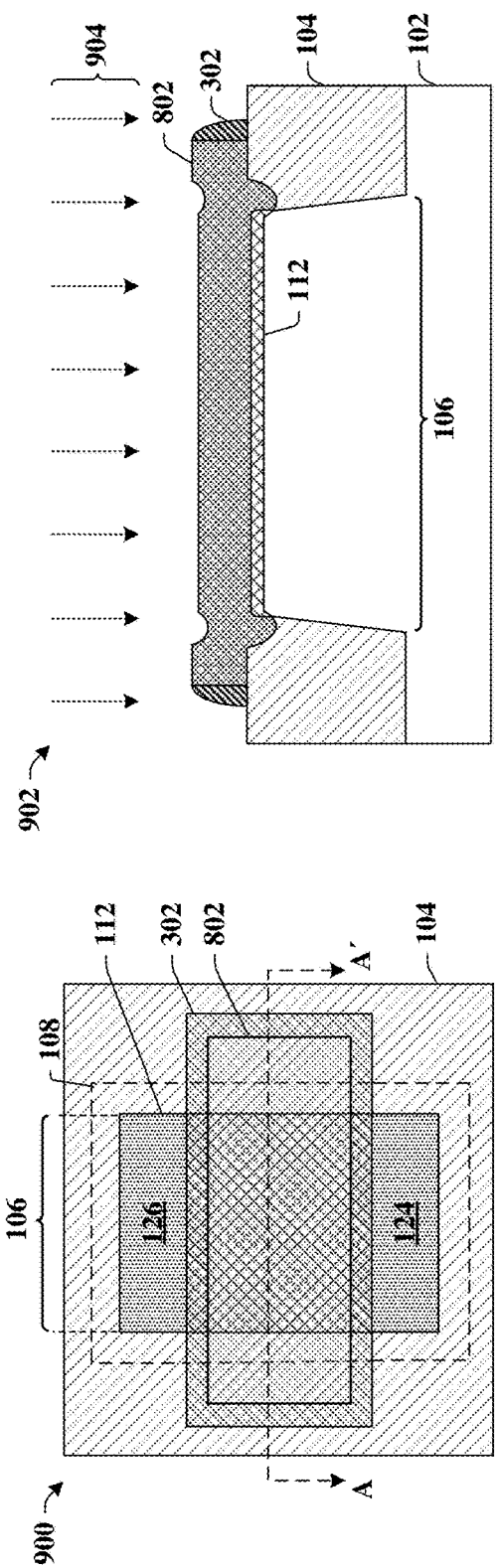
Fig. 8A
Fig. 8B
Fig. 9A
Fig. 9B

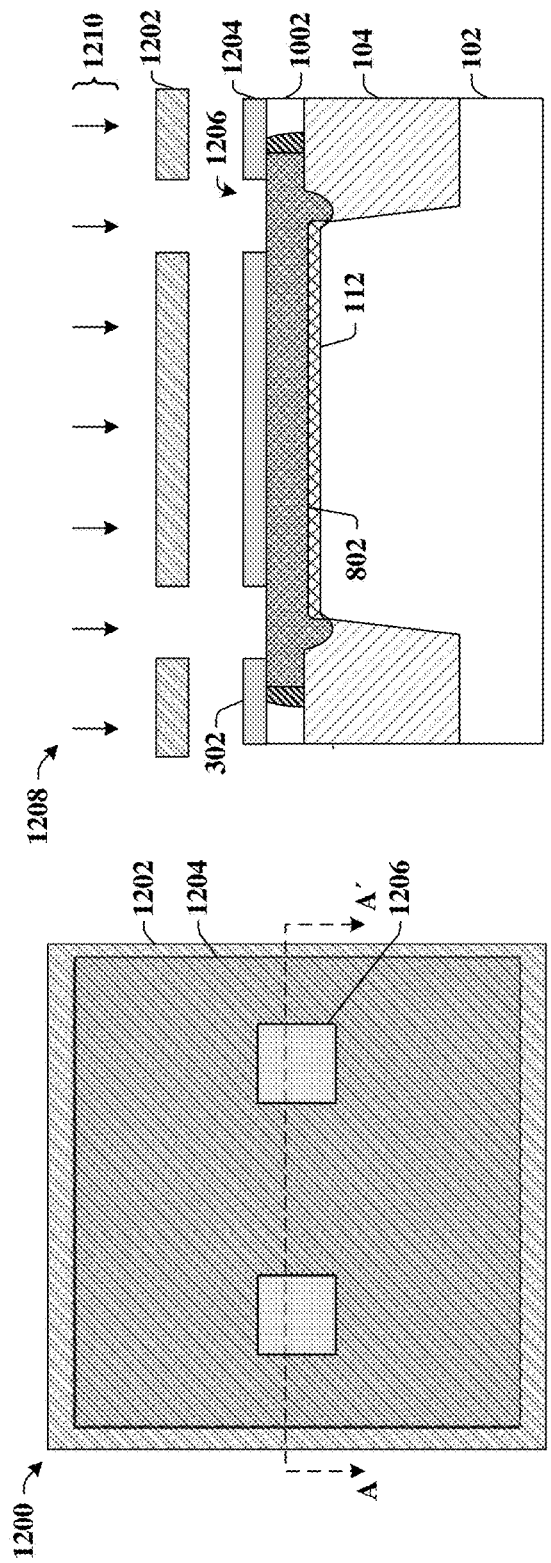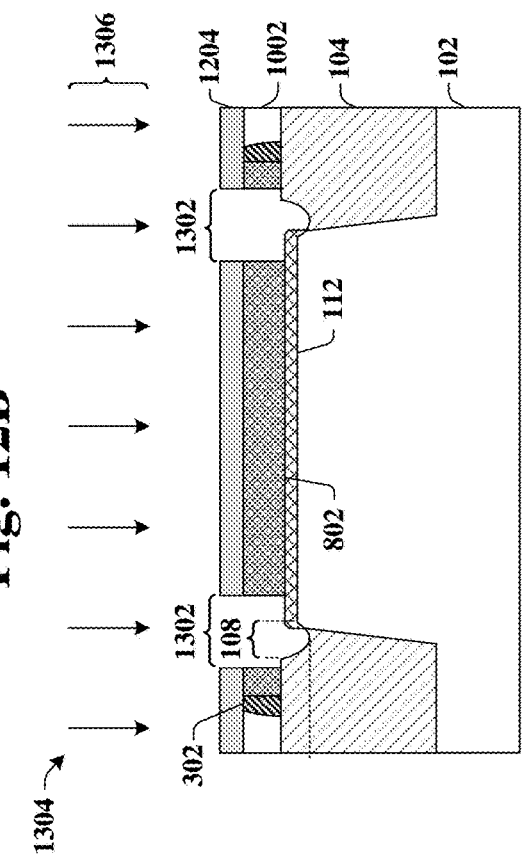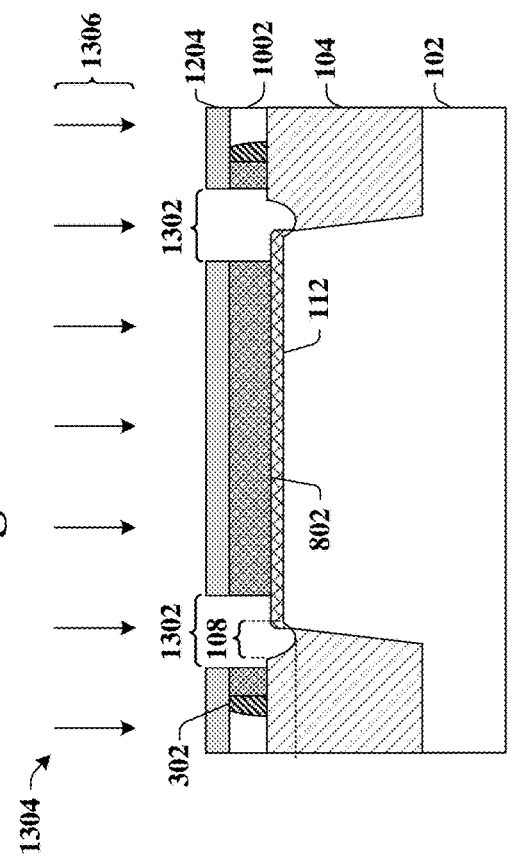

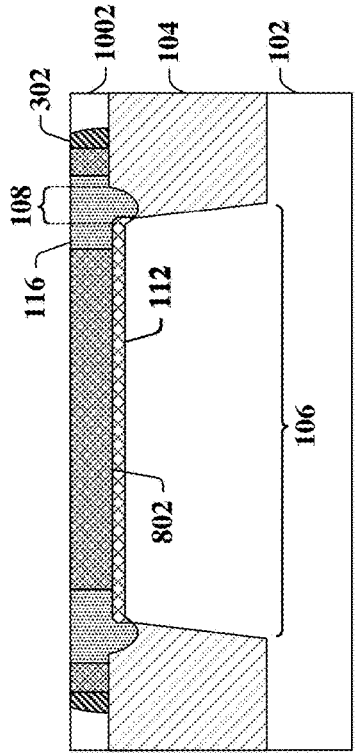
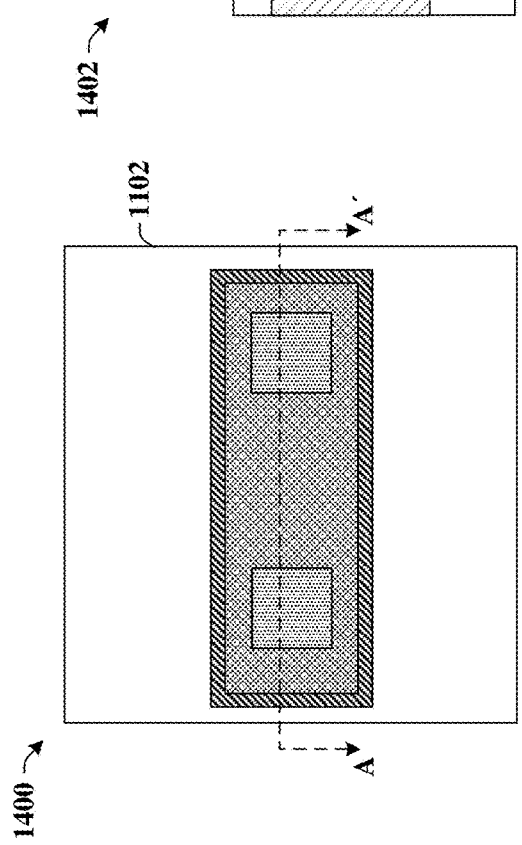
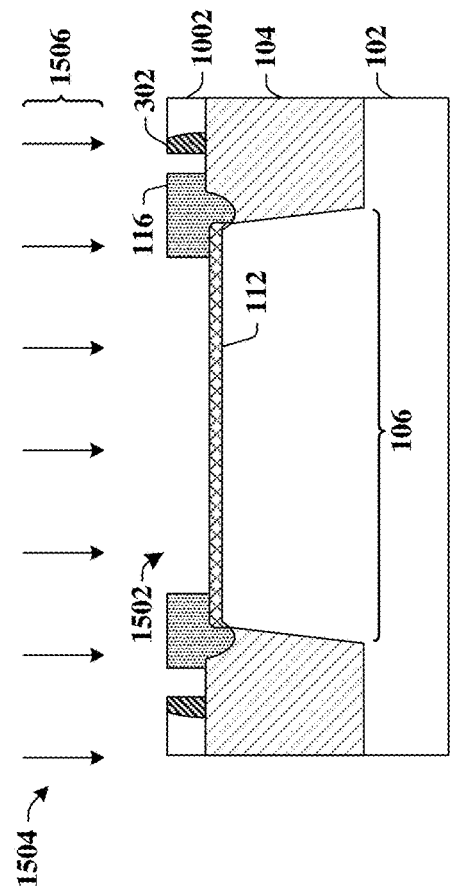
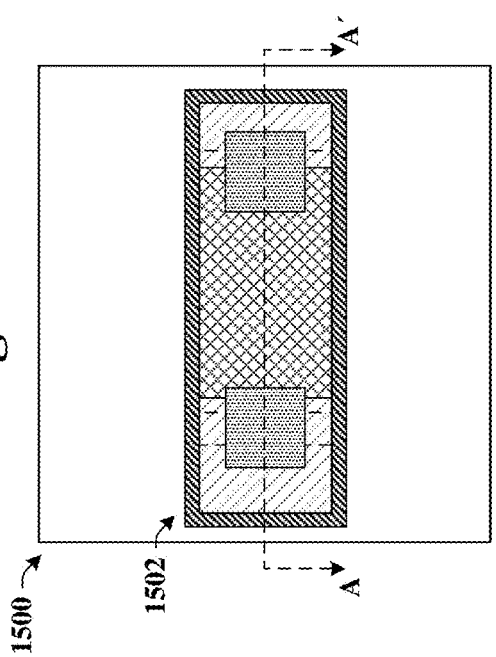

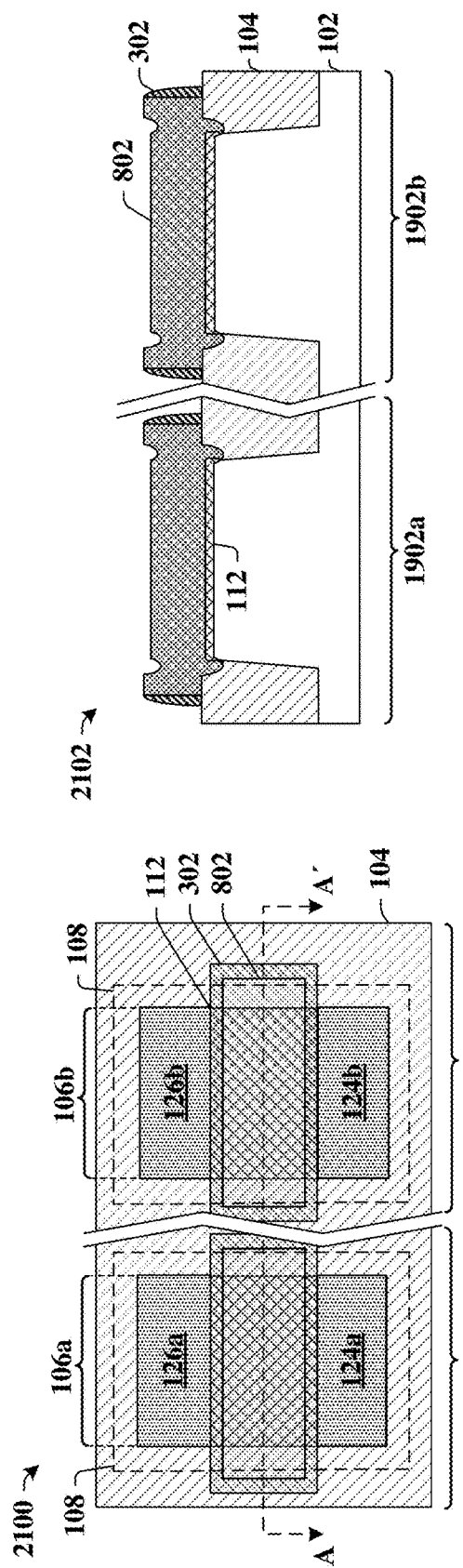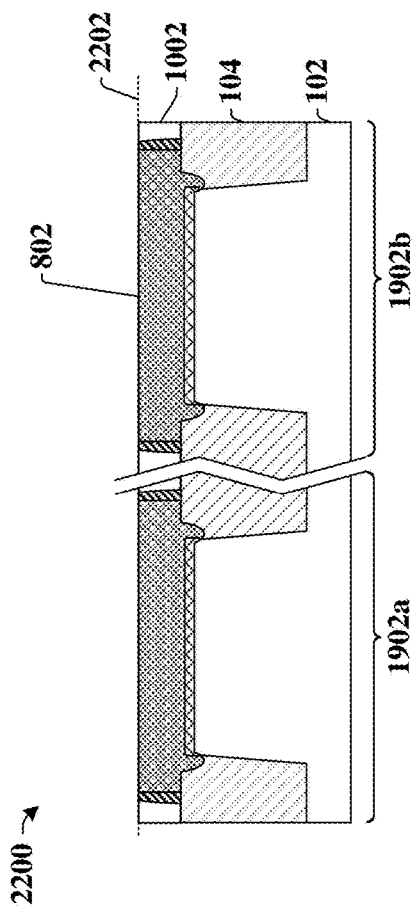
Fig. 21A
Fig. 21B
Fig. 22

METAL GATE MODULATION TO IMPROVE KINK EFFECT

REFERENCE TO RELATED APPLICATIONS

This Application is a Continuation of U.S. application Ser. No. 16/574,205, filed on Sep. 18, 2019, which is a Continuation of U.S. application Ser. No. 15/989,648, filed on May 25, 2018 (now U.S. Pat. No. 10,468,410, issued on Nov. 5, 2019), which claims the benefit of U.S. Provisional Application No. 62/586,346, filed on Nov. 15, 2017. The contents of the above-referenced Patent Applications are hereby incorporated by reference in their entirety.

BACKGROUND

Modern day integrated chips comprise millions or billions of semiconductor devices formed on a semiconductor substrate (e.g., a silicon substrate). To improve functionality of integrated chips, the semiconductor industry has continually reduced the dimension of semiconductor devices to provide for integrated chips with small, densely populated devices. By forming integrated chips having small, densely populated devices, the speed of the devices increases and the power consumption of devices decreases.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2C illustrates graphs showing some embodiments of exemplary absolute threshold voltages corresponding to the transistor device of FIGS. 1A-1B.

FIGS. 5A-5B illustrate some additional embodiments of an integrated chip having a transistor device comprising a gate structure configured to improved device performance.

FIGS. 6A-17 illustrate some embodiments of cross-sectional views and top-views corresponding to a method of forming an integrated chip having a transistor device comprising a gate structure configured to improved device performance.

FIGS. 19A-28 illustrate cross-sectional views and top-views corresponding to some alternative embodiments of a method of forming an integrated chip having a transistor device comprising a gate structure configured to improved device performance.

DETAILED DESCRIPTION

Figure 1A:
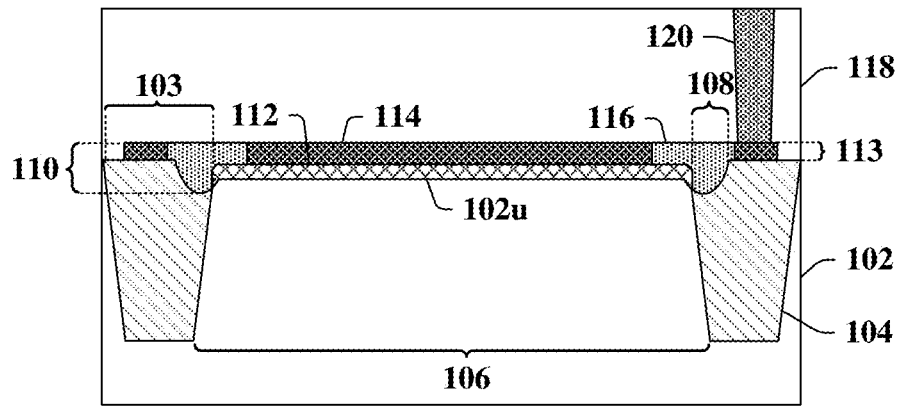
FIGS. 1A-1B illustrate some embodiments of an integrated chip having a transistor device comprising a gate structure configured to improved device performance.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In integrated chips, active devices (e.g., MOSFET devices, embedded memory devices, etc.) are generally arranged on a shared semiconductor substrate (e.g., a silicon substrate). However, semiconductor materials can be electrically conductive, such that leakage currents may travel between active devices that are located within a semiconductor substrate in close proximity to one another. If such leakage currents are not properly mitigated, cross-talk between adjacent devices can lead to integrated chip failure.

To prevent leakage currents from traveling between adjacent devices, many modern day integrated chips use shallow trench isolation (STI) structures. Typically, STI structures are formed by forming a pad oxide over a substrate, patterning the pad oxide according to a nitride masking layer, etching trenches in the substrate according to the nitride masking layer, filling the trenches with one or more dielectric materials (such as silicon dioxide or silicon nitride), and removing excess of the one or more dielectric materials from over the substrate. STI formation processes may furthermore use a wet etching process to remove the nitride masking layer and/or the pad oxide used during formation of the STI structures.

During the formation of an STI structure, divots may form within an upper surface of the STI structure (e.g., due to the wet etching process used to remove the nitride masking layer and/or pad oxide). A conductive gate material of a transistor device can subsequently fill the divots within the STI structure, causing the conductive gate material to have sharp edges. During operation of the transistor device, the sharp edges can enhance an electric field generated by a gate structure and decrease a threshold voltage of the device near the divots, resulting in a problem called the kink effect, which is defined by a double hump in a drain current vs. gate voltage relation. The kink effect has a number of negative consequences, such as being difficult to model (e.g., in SPICE curve fitting and/or parameter extraction). Furthermore, it has been appreciated that the thermal processes used in multiple gate dielectric processes (e.g., in processes that form different gate dielectrics in different regions of a substrate) may enhance the diffusion of dopants from the substrate (e.g., from a well region) into the STI structures, resulting in lower dopant concentrations along edges of a channel region of a transistor device. The lower dopant concentrations further decrease the threshold voltage along edges of the channel region, thereby aggravating the kink effect.

The present disclosure, in some embodiments, relates to a transistor device having a gate structure comprising multiple gate electrode regions having different work functions configured to reduce a susceptibility of the transistor device to the kink effect, and an associated method of formation. The transistor device comprises an isolation structure arranged within a substrate. The isolation structure has interior surfaces defining one or more divots recessed below an uppermost surface of the isolation structure and sidewalls defining an opening exposing the substrate. A source region is disposed within the opening. A drain region is also disposed within the opening and is separated from the source region by a channel region. A gate structure extends over the opening between the source region and the drain region. The gate structure comprises a first gate electrode region having a first composition of one or more materials and a second gate electrode region having a second composition of one or more materials different than the first composition of one or more materials. The second gate electrode region is disposed over the divots. The different compositions of materials within the gate structure have different work functions that are able to be used to tune a threshold voltage of the transistor device to offset the undesirable effect of divots and/or dopant diffusion on the threshold voltage.

Figure 1B:
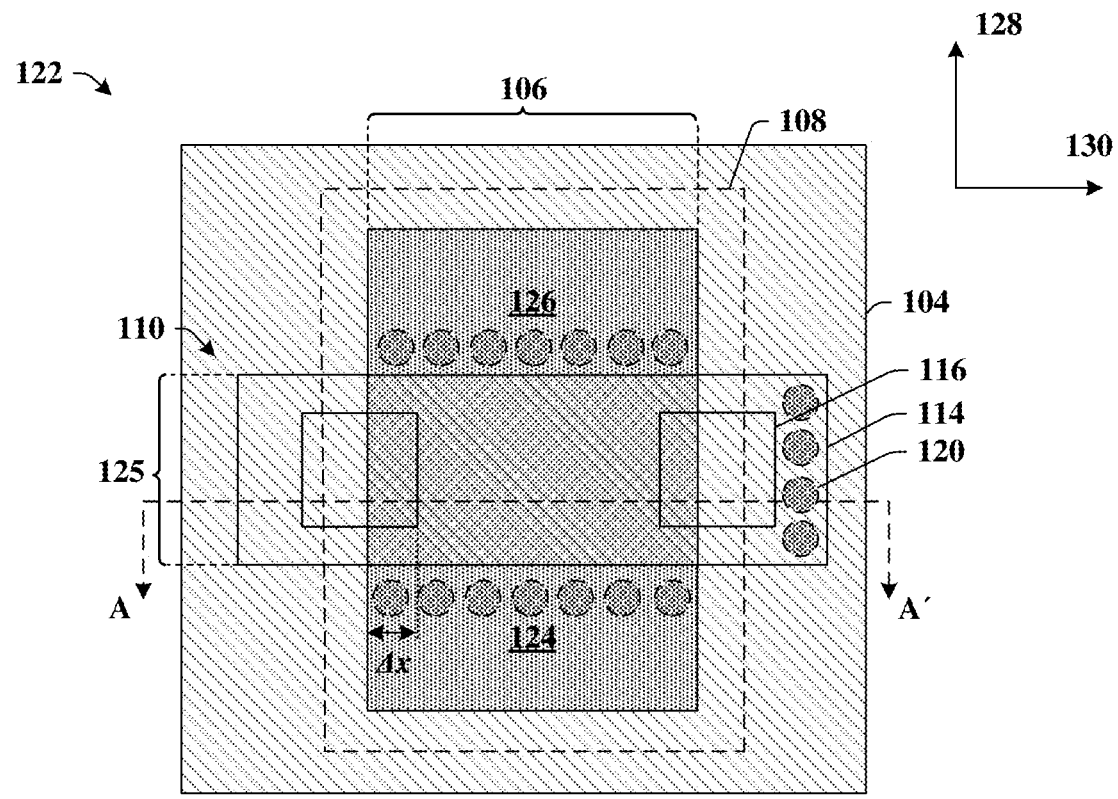

FIGS. 1A-1B illustrate some embodiments of an integrated chip having a transistor device comprising a gate structure configured to improved device performance.

As shown in cross-sectional view 100 FIG. 1A, the integrated chip comprises a substrate 102 having interior surfaces defining a trench 103 extending within an upper surface 102u of the substrate 102. An isolation structure 104 (e.g., a shallow trench isolation (STI) structure) comprising one or more dielectric materials is disposed within the trench 103. The isolation structure 104 comprises sidewalls defining an opening 106 that exposes the upper surface 102u of the substrate 102. The opening 106 corresponds to an active area (i.e., an area of the substrate 102 where a transistor device is located). The isolation structure 104 further comprises surfaces defining one or more divots 108 that are recessed below an uppermost surface of the isolation structure 104. The one or more divots 108 may be arranged along an edges of the isolation structure 104 that are proximate to the opening 106.

As shown in the top-view 122 of FIG. 1B, the isolation structure 104 continuously extends around the opening 106, and the one or more divots 108 within the isolation structure 104 surround the opening 106. A source region 124 and a drain region 126 are arranged in the substrate 102 within the opening 106. The source region 124 and the drain region 126 respectively comprise highly doped regions disposed in the substrate 102. The source region 124 is separated from the drain region 126 along the first direction 128 by a channel region 125. A gate structure 110 extends over the channel region 125 along a second direction 130 that is perpendicular to the first direction 128.

Referring again to cross-sectional view 100 of FIG. 1A, the gate structure 110 is disposed over the substrate 102 and extends past opposing edges of the opening 106. The gate structure 110 comprises a gate dielectric 112 arranged over the substrate 102, and a gate electrode 113 separated from the substrate 102 by the gate dielectric 112. A conductive contact 120 is arranged within a dielectric structure 118 (e.g., an inter-level dielectric (ILD) layer) over the substrate 102. The conductive contact 120 vertically extends from a top of the gate structure 110 to a top of the dielectric structure 118.

The gate electrode 113 comprises a first gate electrode region 114 and a second gate electrode region 116. The first gate electrode region 114 has a first work function and the second gate electrode region 116 has a second work function that is different than (e.g., higher than) the first work function. In some embodiments, the first gate electrode region 114 comprises a first composition of one or more materials having the first work function and the second gate electrode region 116 comprises a second composition of one or more materials that is different than the first composition of one or more materials and that has the second work function. In some embodiments, the first composition of one or more materials and the second composition of one or more materials do not comprise a same material.

In some embodiments, wherein the transistor device is a NMOS device, the first composition of one or more materials (in the first gate electrode region 114) comprises an n-type gate metal with a first work function, while the second composition of one or more materials (in the second gate electrode region 116) comprises a p-type gate metal with a second work function that is greater than the first work function (so as to increase an absolute value of a threshold voltage below the second gate electrode region 116). In other embodiments, wherein the transistor device is a PMOS device, the first composition of one or more materials (in the first gate electrode region 114) comprises a p-type gate metal with a first work function, while the second composition of one or more materials (in the second gate electrode region 116) comprises an n-type gate metal with a second work function that is less than the first work function (so as to increase an absolute value of a threshold voltage below the second gate electrode region 116). In some embodiments, the gate structure 110 may comprise multiple first gate electrode regions and/or multiple second gate electrode regions. For example, in some embodiments, the gate structure 110 may comprise separate second gate electrode regions 116 arranged on opposing sides of the opening 106 and separated by a first gate electrode region 114.

As shown in the top-view 122 of FIG. 1B, the first gate electrode region 114 and the second gate electrode region 116 are arranged directly over the channel region 125. In some embodiments, the channel region 125 continuously extends from directly below the second gate electrode region 116 to past outer edges of the second gate electrode region 116 along the first direction 128 and along the second direction 130. In some embodiments, the second gate electrode region 116 extends to a distance of Δx over opposing sides of the channel region 125 along the second direction 130.

During operation, the gate structure 110 is configured to form a conductive channel within the channel region 125 in response to an applied gate voltage. The different work functions of the different gate electrode regions cause charge carriers within the channel region to respond differently to the applied voltage. For example, the greater work function of the second gate electrode region 116 causes the gate electrode 113 to use a higher threshold voltage to form a conductive channel below the second gate electrode region 116 than below the first gate electrode region 114. The higher threshold voltage required to form a conductive channel below the second gate electrode region 116 offsets a decrease in threshold voltage that is caused by the one or more divots 108 and/or by a diffusion of dopants (e.g., boron) from the substrate 102 into the isolation structure 104. By mitigating an effect of the one or more divots 108 and/or by the diffusion of dopants from the substrate 102 into the isolation structure 104, a performance of the transistor device is improved (e.g., the kink effect in the drain current is reduced).

Figure 2A:
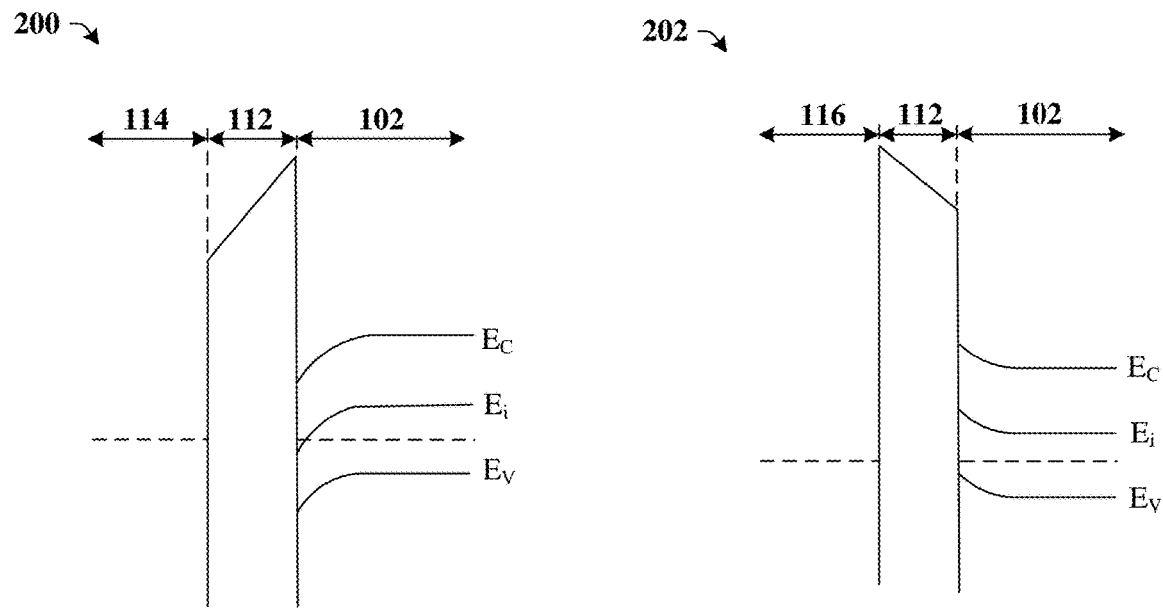
FIGS. 2A-2B illustrate some embodiments of exemplary band diagrams corresponding to the transistor device of FIGS. 1A-1B.
Figure 2B:
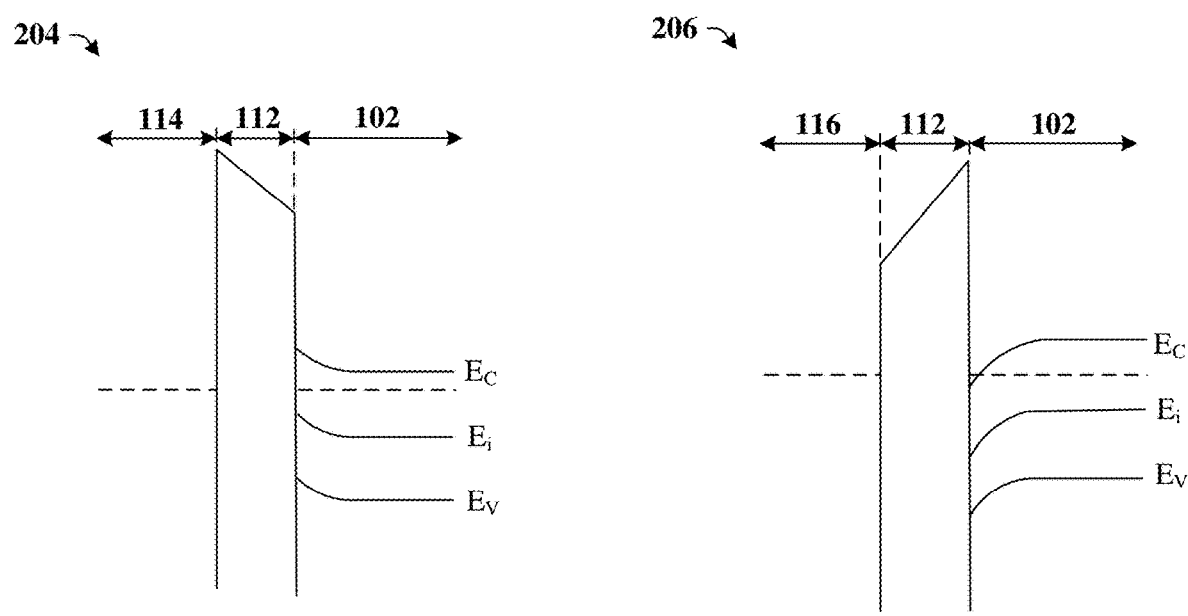

FIGS. 2A-2B illustrate some embodiments of exemplary band diagrams along the first gate electrode region and along the second gate electrode region of the integrated chip of FIGS. 1A-1B FIG. 2A illustrates some embodiments of exemplary band diagrams, 200 and 202, for an NMOS transistor along the first gate electrode region and along the second gate electrode region of the integrated chip of FIGS. 1A-1B.

As shown in band diagram 200, the gate dielectric 112 forms an energy barrier between the substrate 102 and the first gate electrode region 114. The first composition of one or more materials (e.g., an n-metal gate material) gives the first gate electrode region 114 a first work function that causes an upward bending of the conduction band $E_c$ and the valence band $E_v$ within the substrate 102 (so that within the substrate 102 a distance between a vacuum level and $E_c$ and/or $E_v$ increases as a distance from the gate dielectric 112 decreases). As shown in band diagram 202, the gate dielectric 112 also forms an energy barrier between the substrate 102 and the second gate electrode region 116. The second composition of one or more materials (e.g., a p-metal gate material) gives the second gate electrode region 116 a second work function. The second work function of the second composition of one or more materials is larger than the first work function of the first composition of one or more materials (i.e., the second gate electrode region 116 has a larger work function than the first gate electrode region 114). The larger second work function causes a downward bending of the conduction band $E_c$ and the valence band $E_v$ within the substrate 102 (so that within the substrate 102 a distance between the vacuum level and $E_c$ and/or $E_v$ decreases as a distance from the gate dielectric 112 decreases).

FIG. 2B illustrates some embodiments of exemplary band diagrams, 204 and 206, for a PMOS transistor along the first gate electrode region and along the second gate electrode region of the integrated chip of FIGS. 1A-1B.

As shown in band diagram 204, the gate dielectric 112 forms an energy barrier between the substrate 102 and the first gate electrode region 114. The first composition of one or more materials (e.g., a p-metal gate material) gives the first gate electrode region 114 a first work function that causes a downward bending of the conduction band $E_c$ and the valence band $E_v$ within the substrate 102 (so that within the substrate 102 a distance between a vacuum level and $E_c$ and/or $E_v$ decreases as a distance from the gate dielectric 112 decreases). As shown in band diagram 206, the gate dielectric 112 also forms an energy barrier between the substrate 102 and the second gate electrode region 116. The second composition of one or more materials (e.g., an n-metal gate material) gives the second gate electrode region 116 a second work function. The second work function of the second composition of one or more materials is less than the first work function of the first composition of one or more materials (i.e., the second gate electrode region 116 has a smaller work function than the first gate electrode region 114). The smaller second work function may cause an upward bending of the conduction band $E_c$ and the valence band $E_v$ within the substrate 102 (so that within the substrate 102 a distance between the vacuum level and $E_c$ and/or $E_v$ increases as a distance from the gate dielectric 112 decreases).

FIG. 2C illustrates some embodiments of graphs, 208 and 212, showing examples of how different features of the integrated chip affect the absolute threshold voltage (shown along the y-axis) as a function of a position within an active area (shown along x-axis).

Graph 208 illustrates an example of an effect of divots and/or dopant (e.g., boron) diffusion on the absolute threshold voltage. As shown by line 210 of graph 208, due to the one or more divots within the isolation structure and/or dopant diffusion into the isolation structure, an absolute threshold voltage is lower below the second gate electrode region 116 than below the first gate electrode region 114.

Graph 212 illustrates an example of an effect of the different work functions of the first gate electrode region 114 and the second gate electrode region 116 on the absolute threshold voltage. As shown by line 214 of graph 212, due to the different work functions of the first gate electrode region 114 and the second gate electrode region 116, the gate structure has a higher absolute threshold voltage below the second gate electrode region 116 than below the first gate electrode region 114. In some embodiments, a difference in the absolute threshold voltage $\Delta V_{TH}$ below the first gate electrode region 114 and below the second gate electrode region 116 is in a range of between approximately 0.5 V and approximately 1.5 V.

The higher absolute threshold voltage below the second gate electrode region 116 (shown in graph 212) offsets the decrease in absolute threshold voltage that is caused by the one or more divots and/or by the diffusion of dopants (shown in graph 208) from the substrate into the isolation structure. By mitigating an effect of the one or more divots or by the diffusion of dopants from the substrate into the isolation structure, a performance of the transistor device is improved (e.g., the kink effect in the drain current caused by the effect of the one or more divots on the electric field generated by the gate structure is reduced).

Figure 3A:
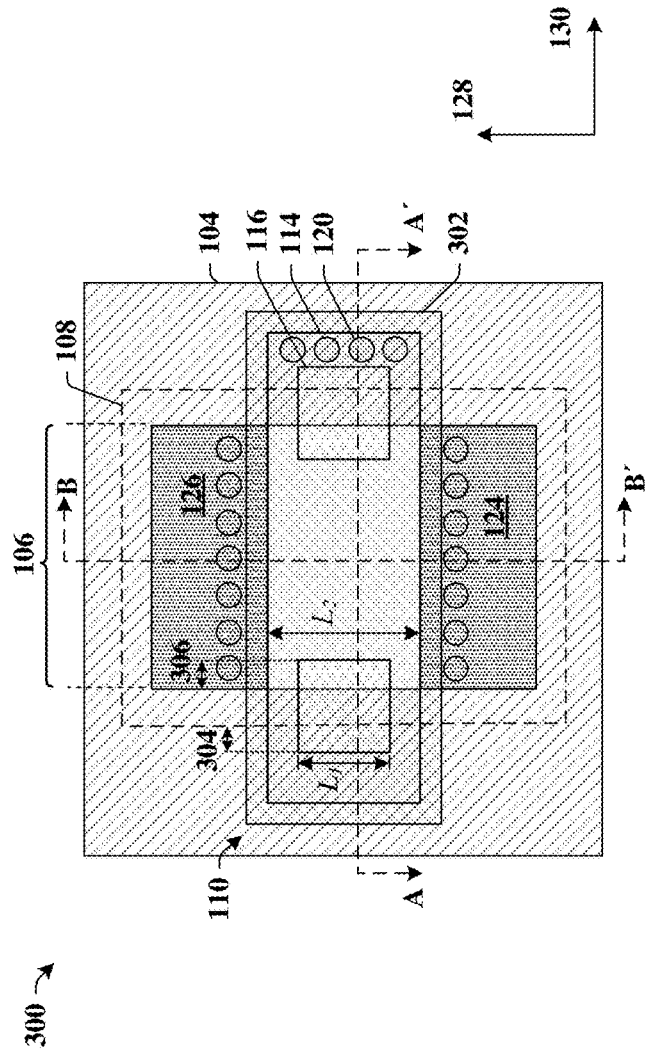
FIGS. 3A-3C illustrates some additional embodiments of an integrated chip having a transistor device comprising a gate structure configured to improved device performance.
Figure 3C:
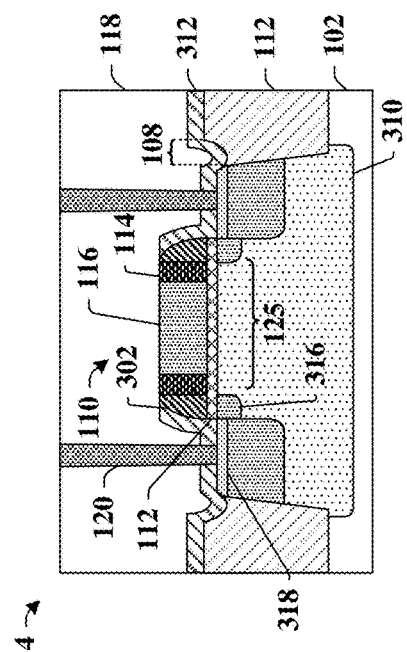
Figure 3B:
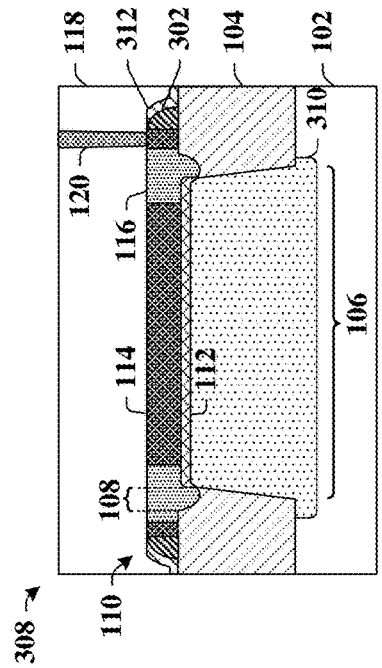

FIGS. 3A-3C illustrate some additional embodiments of an integrated chip having a transistor device comprising a gate structure configured to improved device performance.

As shown in top-view 300 of FIG. 3A, the integrated chip has an isolation structure 104 that defines an opening 106 exposing a substrate 102 within an active region. In some embodiments, the opening 106 may have a substantially rectangular shape. In other embodiments, the opening 106 may have an alternative shape (e.g., a circular shape). A source region 124 is arranged within the opening 106. A drain region 126 is also arranged within the opening 106 at a location separated and the source region 124 along a first direction 128.

A gate structure 110 extends over the opening 106 along a second direction 130 perpendicular to the first direction 128. The gate structure 110 is arranged between the source region 124 and the drain region 126. The gate structure 110 comprises a first gate electrode region 114 and a second gate electrode region 116. In some embodiments, the first gate electrode region 114 comprises a continuous segment, while the second gate electrode region 116 may comprise two or more separate and distinct segments. In some embodiments, the first gate electrode region 114 may comprise an n-type gate metal (e.g., a metal having a work function of less than or equal to approximately 4.2 eV), while the second gate electrode region 116 may comprise a p-type metal (e.g., a metal having a work function of greater than or equal to approximately 5.0 eV). For example, in some embodiments, the first gate electrode region 114 may comprise an n-type metal such as aluminum, tantalum, titanium, hafnium, zirconium, titanium silicide, tantalum nitride, tantalum silicon nitride, chromium, tungsten, cooper, titanium aluminum, or the like. In some embodiments, the second gate electrode region 116 may comprise a p-type gate metal such as nickel, cobalt, molybdenum, platinum, lead, gold, tantalum nitride, molybdenum silicide, ruthenium, chromium, tungsten, copper, or the like.

In some embodiments, the first gate electrode region 114 contacts the second gate electrode region 116 along the first direction 128 and along a second direction 130 that is perpendicular to the first direction 128. In some embodiments, the second gate electrode region 116 is arranged within apertures (i.e., openings) in the first gate electrode region 114. In some such embodiments, the first gate electrode region 114 extends around a perimeter of the gate structure 110, so that the second gate electrode region 116 is completely surrounded by the first gate electrode region 114.

In some embodiments, the second gate electrode region 116 may have a first length $L_1$ along the first direction 128 that is less than a second length $L_2$ of the gate structure 110 along the first direction 128. In some embodiments, the second gate electrode region 116 may straddle (i.e., extend past opposing sides of) the one or more divots 108 along the second direction 130. For example, the second gate electrode region 116 may extend past a first side of the one or more divots 108 by a first non-zero distance 304 and past a second side of the one or more divots 108 by a second non-zero distance 306. In some embodiments, the first non-zero distance 304 may be substantially equal to the second non-zero distance 306. In some embodiments, the first gate electrode region 114 and the second gate electrode region 116 may be substantially symmetric along a first line extending in the first direction 128 and/or along a second line extending in the second direction 130.

In some embodiments, sidewall spacers 302 may be arranged along outer sidewalls of the gate structure 110. The sidewall spacers 302 comprise one or more dielectric materials. For example, in various embodiments, the sidewall spacers 302 may comprise an oxide (e.g., silicon oxide), a nitride (e.g., silicon nitride, silicon oxy-nitride, etc.), a carbide (e.g., silicon carbide), or the like. In some embodiments, the gate structure 110 and/or the sidewall spacers 302 may extend along the first direction 128 over of the source region 124 and/or the drain region 126.

FIG. 3B illustrates a cross-sectional view 308 of the integrated chip of FIG. 3A along cross-sectional line A-A'

As shown in cross-sectional view 308, the first gate electrode region 114 and the second gate electrode region 116 are separated from the substrate 102 by a gate dielectric 112. In some embodiments, a well region 310 may be disposed within the substrate 102 below the opening 106. The well region 310 has a doping type that is different than that of the substrate 102. For example, in some embodiments where the transistor device is an NMOS transistor the substrate 102 may have a p-type doping, the well region 310 may have an n-type doping, and the source region 124 and the drain region 126 have the p-type doping.

The first gate electrode region 114 laterally contacts the second gate electrode region 116, so that the first composition of one or more materials laterally contacts the second composition of one or more materials. The second gate electrode region 116 is over the one or more divots 108. In some embodiments, the second composition of one or more materials fills underlying parts of the one or more divots 108 within the isolation structure 104. In such embodiments, the second composition of one or more materials extends to below a bottommost surface of the first composition of one or more materials. In some embodiments, the second composition of one or more materials directly contacts the surfaces of the isolation structure 104 defining the one or more divots 108. In some embodiments, the first composition of one or more materials extends from within the one or more divots 108 to over the uppermost surface of the isolation structure 104 and over the gate dielectric 112.

In some embodiments, a contact etch stop layer (CESL) 312 may be arranged along sides of the gate structure 110 and the isolation structure 104. In various embodiments, the CESL 312 may comprise a nitride (e.g., silicon nitride), a carbide (e.g., silicon carbide), or the like.

A dielectric structure 118 (e.g., an inter-level dielectric (ILD) layer) is arranged over the substrate 102. In some embodiments, the dielectric structure 118 may comprise borophosphosilicate glass (BPSG), borosilicate glass (BSG), phosphosilicate glass (PSG), or the like. A conductive contact 120 vertically extends through the dielectric structure 118 to the gate structure 110. The conductive contact 120 may comprise tungsten, copper, aluminum copper, or some other conductive material. In some embodiments, the conductive contact 120 contacts the first gate electrode region 114. In such embodiments, the conductive contact 120 has outermost sidewalls that are laterally offset from the second gate electrode region 116 by a non-zero distance.

FIG. 3C illustrates a cross-sectional view 314 of the integrated chip of FIG. 3A along cross-sectional line B-B'.

As shown in cross-sectional view 314, the source region 124 and the drain region 126 are arranged within the well region 310 on opposing sides of the gate structure 110. In some embodiments, source and drain extension regions 316 may protrude outward from the source region 124 and the drain region 126 to below the sidewall spacers 302 and/or the gate structure 110. In such embodiments, a channel region 125 extends between the source and drain extension regions 316. In some embodiments, a silicide layer 318 may be arranged on the source region 124 and the drain region 126. In some embodiments, the silicide layer 318 may comprise a nickel silicide, for example.

Figure 4A:
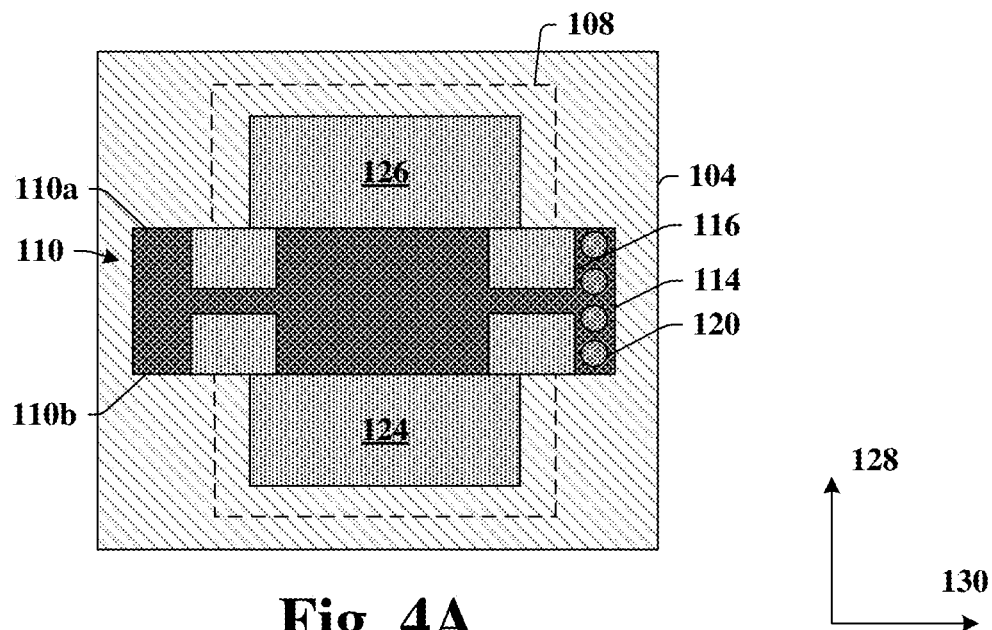
FIGS. 4A-4B illustrate top-views showing some alternative embodiments of integrated chips having a transistor device comprising a gate structure configured to improved device performance.
Figure 4B:
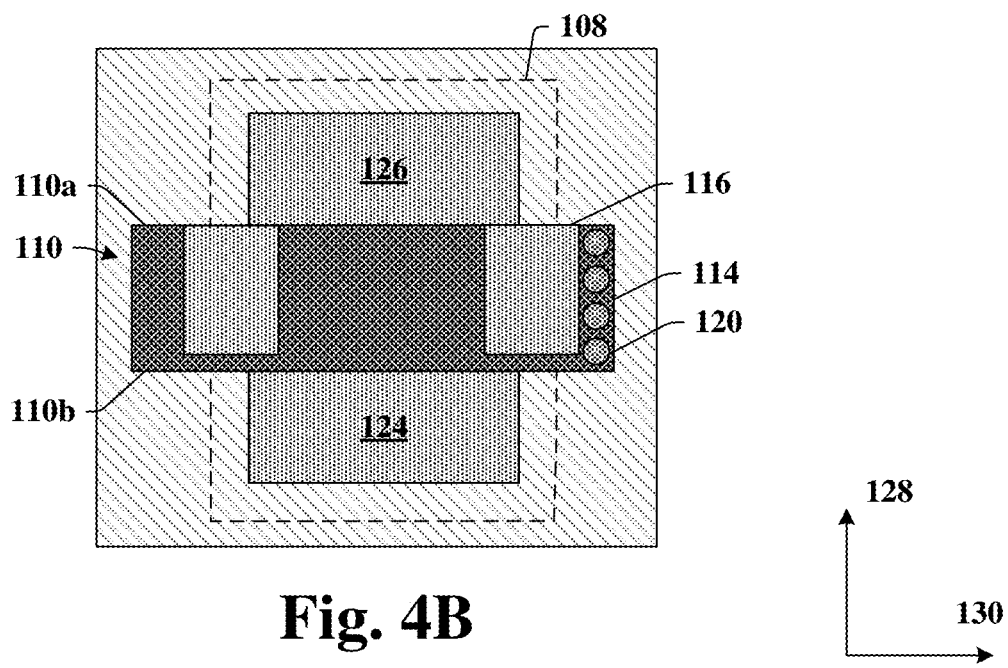

FIGS. 4A-4B illustrate top-views showing some alternative embodiments of integrated chips having a transistor device comprising a gate structure configured to improved device performance.

Referring to top-view 400 of FIG. 4A, in some embodiments the integrated chip comprises an isolation structure 104 defining an opening 106 exposing the substrate 102. A source region 124 and a drain region 126 are arranged within the opening 106 and are separated from one another along a first direction 128. A gate structure 110 extends in a second direction 130 over the opening 106 and between the source region 124 and the drain region 126. The gate structure 110 comprises a first gate electrode region 114 and a second gate electrode region 116. In some embodiments, the second gate electrode region 116 may comprise a first segment arranged along a first side 110a of the gate structure 110 proximate to the drain region 126 and a second segment arranged along an opposing, second side 110b of the gate structure 110 proximate to the source region 124. In some such embodiments, the second gate electrode region 116 is non-continuous between the first side 110a of the gate structure 110 and the second side 110b of the gate structure 110, so that segments of the second gate electrode region 116 are separated along the first direction 128 by the first gate electrode region 114. In some embodiments, the second gate electrode region 116 is symmetric about a first line bisecting the gate structure 110 along the first direction 128 and a second line bisecting the gate structure 110 along the second direction 130.

Referring to top-view 402 of FIG. 4B, in some embodiments the integrated chip comprises a gate structure 110 that extends in a second direction 130 over an opening 106 and between a source region 124 and a drain region 126. The gate structure 110 comprises a first gate electrode region 114 and a second gate electrode region 116. The second gate electrode region 116 is arranged over the one or more divots 108 in the isolation structure 104 and is disposed along a first side 110a of the gate structure 110 and is separated from an opposing, second side 110b of the gate structure 110.

It has been appreciated that the formation of different gate dielectric layers within different regions of an integrated chip may aggravate the kink effect within transistor devices, due to additional etch processes that may increase a size of divots within isolation structures and/or additional thermal processes that may increase dopant diffusion. For example, in some processes used to form multiple gate dielectric layers, a gate oxide may be thermally grown on a substrate (but not on surrounding isolation structures). The gate oxide may be subsequently removed from the substrate in some device regions that use a different gate dielectric layer. Removal of the gate oxide is done by an etch that also acts on the isolation structures. Due to over etching, the removal of the gate oxide may increase a size of divots within the isolation structures.

FIGS. 5A-5B illustrate some embodiments of an integrated chip having different gate dielectric layers within different regions.

The integrated chip comprises a first logic region 502, an embedded memory region 512, and a second logic region 522. Isolation structures 104 are arranged within the substrate 102 within the first logic region 502, the embedded memory region 512, and the second logic region 522. The first logic region 502 comprises a high voltage transistor device that is configured to provide a higher breakdown voltage than a dual gate transistor device arranged within the second logic region 522.

As shown in cross-sectional view 500 of FIG. 5A, the isolation structure 104 within the first logic region 502 has sidewalls defining an opening 106 exposing a first upper surface of the substrate 102. A high voltage gate electrode 508 is arranged over the opening 106 and is vertically separated from a substrate 102 by way of a high voltage gate dielectric layer 504 and a dual-gate dielectric layer 506 having a first gate dielectric layer 506a and a second gate dielectric layer 506b. In some embodiments, the high voltage gate electrode 508 is vertically separated from a high voltage well 510 disposed within the substrate 102.

The high voltage gate electrode 508 comprises a first gate electrode region 114 having a first work function and a second gate electrode region 116 having a second work function that is larger than the first work function. The second gate electrode region 116 is arranged over divots in the isolation structure 104 and contacts sidewalls of the first gate electrode region 114. As shown in top-view 530 of FIG. 5B, the second gate electrode region 116 is arranged directly over the one or more divots 108 within the isolation structure 104, and the first gate electrode region 114 continuously surrounds the second gate electrode region 116.

As shown in cross-sectional view 500 of FIG. 5A, the isolation structure 104 within the embedded memory region 512 has sidewalls defining an opening 514 exposing a second upper surface of the substrate 102. In some embodiments, a control gate electrode 518 is arranged over the opening 514 and is separated from a substrate 102 by the dual-gate dielectric layer 506 and a charge trapping dielectric structure 516. In some embodiments, the charge trapping dielectric structure 516 may comprise an ONO structure having a nitride layer disposed between a first oxide layer and a second oxide layer. In some embodiments, the control gate electrode 518 is vertically separated from a control well 520 disposed within the substrate 102. As shown in top-view 530 of FIG. 5B, the embedded memory region 512 may also comprise a select gate electrode 532. The control gate electrode 518 and the select gate electrode 532 share a common source/drain region 534. Although the embedded memory region 512 of FIGS. 5A-5B is illustrated as comprising a SONOS flash memory device, it will be appreciated that in other embodiments, the embedded memory region 512 may comprise different types of memory devices. For example, in other embodiments, the embedded memory region 512 may comprise a different type of flash memory device, such as a floating gate flash memory device, a split gate flash memory device, or the like.

As shown in cross-sectional view 500 of FIG. 5A, the isolation structure 104 within the second logic region 522 has sidewalls defining an opening 524 exposing a third upper surface of the substrate 102. A logic gate electrode 526 is vertically separated from a logic well region 528 within the substrate 102 by way of the dual-gate dielectric layer 506. As shown in top-view 530 of FIG. 5B, the logic gate electrode 526 extends between a source region 536 and a drain region 538 arranged within the opening 524 within the second logic region 522. In some embodiments, the logic gate electrode 526 may be homogenous (i.e., have a same composition of gate materials throughout the gate electrode). In other embodiments (not shown), the logic gate electrode 526 may comprises a first gate electrode region having a first work function and a second gate electrode region having a second work function that is different than the first work function.

FIGS. 6A-17 illustrate some embodiments of cross-sectional views and top-views corresponding to a method of forming an integrated chip having a transistor device comprising a gate structure configured to improved device performance. Although FIGS. 6A-17 are described with reference to a method, it will be appreciated that the structures shown in FIGS. 6A-17 are not limited to the method but rather may stand alone separate of the method.

As shown in top-view 600 of FIG. 6A and cross-sectional view 602 of FIG. 6B, an isolation structure 104 is formed within a trench 103 within a substrate 102. The isolation structure 104 defines an opening 106 that exposes an upper surface 102u of the substrate 102. As shown in top-view 600 of FIG. 6A, the opening 106 has a substantially rectangular shape. As shown in cross-sectional view 602 of FIG. 6B, the isolation structure 104 is arranged within a trench 103 defined by interior surfaces of the substrate 102. During formation of the isolation structures 104, one or more divots 108 may be formed within the isolation structure 104 that are recessed below a top of the isolation structure 104. The one or more divots 108 may be arranged along an edges of the isolation structure 104 that are proximate to the opening 106.

In some embodiments, the isolation structure 104 may be formed by selectively etching the substrate 102 to form the trench 103. One or more dielectric materials are subsequently formed within the trench 103. In various embodiments, the substrate 102 may be selectively etched by a wet etchant (e.g., hydrofluoric acid, potassium hydroxide, or the like) or a dry etchant (e.g., having an etching chemistry comprising fluorine, chlorine, or the like). In various embodiments, the substrate 102 may be any type of semiconductor body (e.g., silicon, SiGe, SOI, etc.), as well as any other type of semiconductor, epitaxial, dielectric, or metal layers, associated therewith. In various embodiments, the one or more dielectric materials may comprise an oxide, a nitride, a carbide, or the like.

In some additional embodiments, the isolation structure 104 may be formed by using a thermal process to form a pad oxide over the substrate 102, followed by the formation of a nitride film over the pad oxide. The nitride film is subsequently patterned (e.g., using a photosensitive material, such as photoresist), and the pad oxide and substrate 102 are patterned according to the nitride film to form the trench 103 within the substrate 102. The trench 103 is then filled with one or more dielectric materials, followed by a planarization process (e.g., a chemical mechanical planarization process) to expose a top of the nitride film and an etch to remove the nitride film.

As shown in top-view 700 of FIG. 7A and cross-sectional view 702 of FIG. 7B, a gate dielectric 112 is formed over the substrate 102 and within the opening 106. In some embodiments, the gate dielectric 112 may comprise an oxide (e.g., silicon oxide), a nitride (e.g., silicon oxy-nitride), or the like. In some embodiments, the gate dielectric 112 may be formed by a vapor deposition technique (e.g., PVD, CVD, PE-CVD, ALD, etc.). In other embodiments, the gate dielectric 112 may be formed by way of a thermal growth process. In some embodiments, an implantation process may be performed prior to the formation of the gate dielectric 112 to form a well region (not shown) in the substrate 102. In some such embodiments, a sacrificial dielectric layer (not shown) may be formed over the substrate 102 prior to the implantation process to regulate a depth of the well region. The sacrificial dielectric layer is subsequently removed prior to formation of the gate dielectric 112.

In some embodiments, the gate dielectric 112 may be formed as part of a multiple gate dielectric process, in which different gate dielectric layers are formed within different regions of the substrate 102. For example, in some embodiments, the multiple gate dielectric process may form a high voltage gate dielectric layer (e.g., by a thermal process) over a high voltage well within the substrate 102. The high voltage gate dielectric layer may be subsequently removed from one or more regions of a chip (e.g., within an embedded memory region), and a dual-gate dielectric layer may be over a logic well within the substrate 102 (e.g., by one or more deposition processes). It has been appreciated that the formation of multiple gate dielectric layers may aggravate the kink effect within associated transistor devices by increasing a size of the one or more divots 108 within the isolation structure 104 (due to the additional etch processes that are performed to remove the gate dielectric layers from different regions of the substrate) and/or by increasing dopant diffusion from the substrate 102 to the isolation structure 104 (due to additional thermal processes used to form the gate dielectric layers).

As shown in top-view 800 of FIG. 8A and cross-sectional view 804 of FIG. 8B, a sacrificial gate material 802 is formed over the gate dielectric 112 and over the isolation structure 104. The sacrificial gate material 802 may fill the one or more divots 108 within the upper surface of the isolation structure 104. The sacrificial gate material 802 may be formed by way of a deposition process (e.g., CVD, PE-CVD, PVD, or ALD). In some embodiments, the sacrificial gate material 802 may comprise doped polysilicon. The gate dielectric 112 and the sacrificial gate material 802 are patterned to define a sacrificial gate structure extending over the opening 106 and over the isolation structure 104. In some embodiments, the gate dielectric 112 and the sacrificial gate material 802 may be patterned according to a masking layer (not shown) formed over the sacrificial gate material 802. In various embodiments, the masking layer may comprise a photosensitive material (e.g., photoresist) or a hard mask layer.

In some embodiments, one or more sidewalls spacers 302 may be formed on opposing sides of the sacrificial gate material 802. In some embodiments, the one or more sidewall spacers 302 may be formed by depositing a spacer material (e.g., a nitride or an oxide) onto horizontal and vertical surfaces of the sacrificial gate material 802, and subsequently etching the spacer material to remove the spacer material from the horizontal surfaces to form the one or more sidewall spacers 302.

As shown in top-view 900 of FIG. 9A and cross-sectional view 902 of FIG. 9B, a source region 124 and a drain region 126 are formed within the substrate 102 on opposing sides of the sacrificial gate material 802. The source region 124 and the drain region 126 comprise a doping type that is different than a doping type of the substrate surrounding the source region 124 and the drain region 126. For example, the source region 124 and the drain region 126 may comprise a first doping type (e.g., an n-type doping) within a substrate 102 or well region (not shown) having a second doping type (e.g., a p-type doping).

In some embodiments, the source region 124 and the drain region 126 may be formed by an implantation process. The implantation process may be performed by selectively implanting a dopant species 904 into the substrate 102 according to a mask comprising the sacrificial gate material 802 and the sidewall spacers 302. In various embodiments, the dopant species 904 may comprise a p-type dopant (e.g., boron, gallium, etc.) or an n-type dopant (e.g., phosphorus, arsenic, etc.). In some embodiments, after implanting the dopant species 904 into the substrate 102, a drive-in anneal may be performed to diffuse the dopant species 904 within the substrate 102. In some embodiments, an addition implantation processes may be performed to form source and drain extension regions within the substrate. In such embodiments, the additional implantation processes may comprise angled implantation processes so that the source and drain extension regions extend below the sacrificial gate material 802.

Figure 10B:
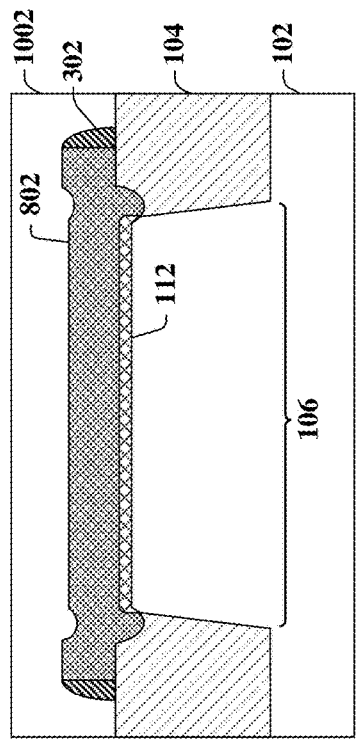
Figure 10A:
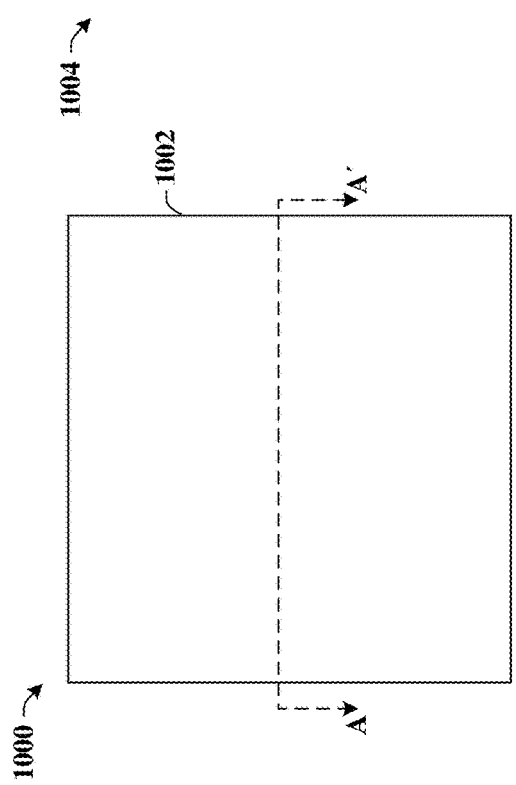

As shown in top-view 1000 of FIG. 10A and cross-sectional view 1004 of FIG. 10B, a first dielectric layer 1002 (e.g., a first inter-level dielectric (ILD) layer) is formed over the substrate 102. The first dielectric layer 1002 covers the sacrificial gate material 802 and the sidewall spacers 302. In various embodiments, the first dielectric layer 1002 may comprise an oxide, PSG, a low κ dielectric, or some other dielectric, and may be formed by vapor deposition process (e.g., CVD, PVD, or ALD).

Figure 11B:
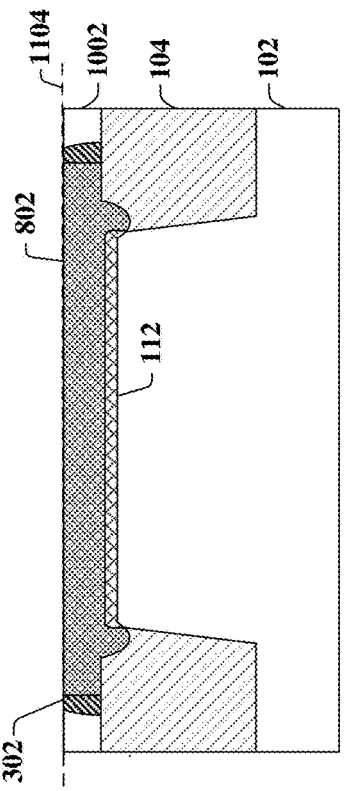
Figure 11A:
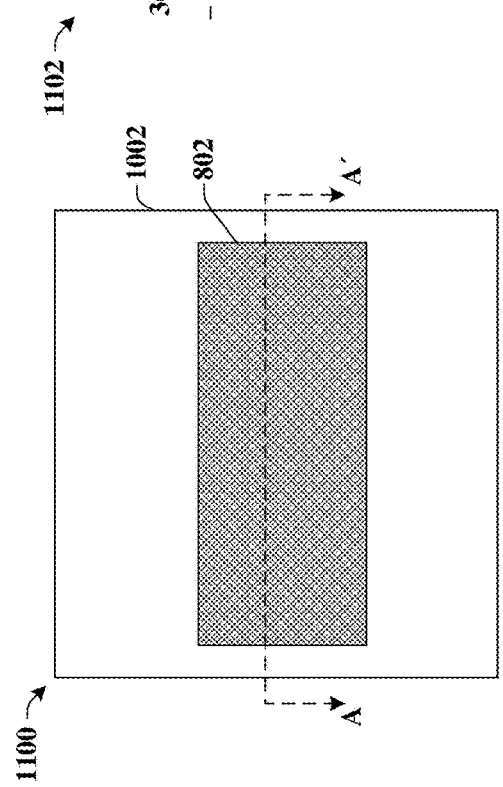

As shown in top-view 1100 of FIG. 11A and cross-sectional view 1102 of FIG. 11B, a planarization process is performed to remove the first dielectric layer 1002 from over sacrificial gate material 802 and the sidewall spacers 302. The planarization process exposes an upper surface of the sacrificial gate material 802, while leaving a part of the first dielectric layer laterally surrounding the sacrificial gate material 802 and the sidewall spacers 302. In some embodiments, the planarization process may comprise a chemical mechanical planarization (CMP) process configured to form a substantially planar surface along line 1104.

As shown in top-view 1200 of FIG. 12A and cross-sectional view 1208 of FIG. 12B, a photosensitive material 1204 is formed over the substrate 102. In some embodiments, the photosensitive material 1204 may comprise a positive photoresist or a negative photoresist formed over the substrate 102 by way of a spin-coating process. The photosensitive material 1204 is selectively exposed to electromagnetic radiation 1210 according to a photomask 1202. The electromagnetic radiation 1210 modifies a solubility of exposed regions within the photosensitive material 1204 to define soluble regions. The photosensitive material 1204 is subsequently developed to define openings 1206 within the photosensitive material 1204 by removing the soluble regions.

As shown in top-view 1300 of FIG. 13A and cross-sectional view 1304 of FIG. 13B, parts of the sacrificial gate material 802 that underlie the openings 1206 within the photosensitive material 1204 are selectively removed. The parts of the sacrificial gate material 802 may be removed by selectively exposing the sacrificial gate material 802 to a first etchant 1306 according to the photosensitive material 1204. Removal of the parts of the sacrificial gate material 802 results in one or more first apertures 1302 extending through the sacrificial gate material 802 to the gate dielectric 112 and the isolation structure 104. The one or more first apertures 1302 are over the one or more divots 108. In various embodiments, the first etchant may comprise a dry etchant having an etching chemistry comprising a fluorine species (e.g., $CF_4$, $CHF_3$, $C_4F_8$, etc.) or a wet etchant comprising hydroflouric acid (HF).

As shown in top-view 1400 of FIG. 14A and cross-sectional view 1402 of FIG. 14B, a second composition of one or more materials is formed within the one or more first apertures 1302 to form a second gate electrode region 116 having a second work function. The second gate electrode region 116 laterally contacts the sacrificial gate material 802. In some embodiments, the second composition of one or more materials may completely fill the one or more first apertures 1302. In some embodiments, the second composition of one or more materials may comprise a p-type gate metal such as platinum, tungsten nitride, molybdenum nitride, tantalum nitride, nickel, or the like. In various embodiments, the second composition of one or more materials may be formed by way of a vapor deposition technique (e.g., PVD, CVD, PE-CVD, ALD, etc.).

As shown in top-view 1500 of FIG. 15A and cross-sectional view 1504 of FIG. 15B, a second part of the sacrificial gate material 802 is removed. In some embodiments, the second part of the sacrificial gate material 802 may be a remainder of the sacrificial gate material 802. The second part of the sacrificial gate material 802 may be removed by exposing the sacrificial gate material 802 to a second etchant 1506. Removal of the second part of the sacrificial gate material 802 results in one or more second apertures 1502 extending through the sacrificial gate material 802 to the gate dielectric 112 and the isolation structure 104. In some embodiments, the one or more second apertures 1502 may surround the second gate electrode region 116. In various embodiments, the second etchant may comprise a dry etchant having an etching chemistry comprising a fluorine species (e.g., $CF_4$, $CHF_3$, $C_4F_8$, etc.) or a wet etchant comprising hydroflouric acid (HF).

Figure 16A:
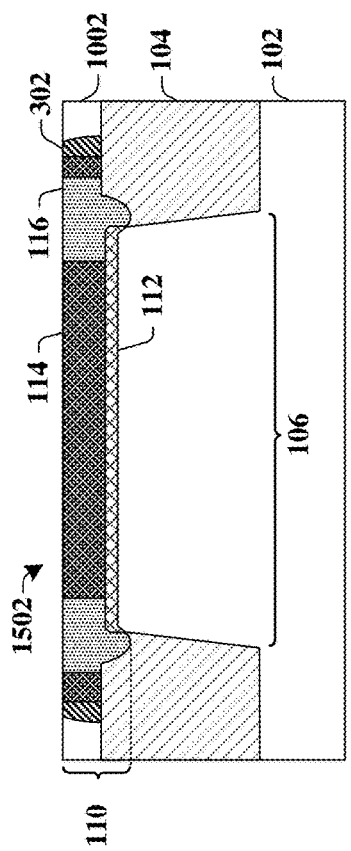
Figure 16B:
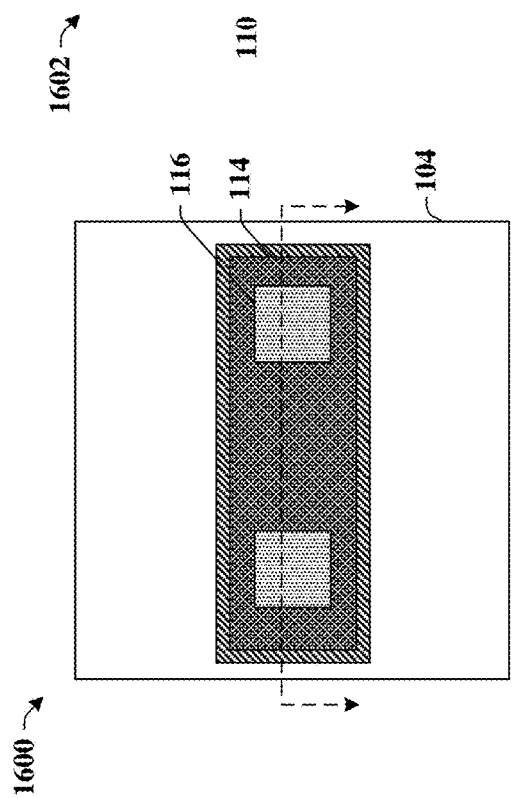

As shown in top-view 1600 of FIG. 16A and cross-sectional view 1602 of FIG. 16B, a first composition of one or more materials is formed within the one or more second apertures 1502 to form a gate structure 110 comprising a first gate electrode region 114 and the second gate electrode region 116 laterally contacting the first gate electrode region 114. The first gate electrode region 114 has a first work function that is different than (e.g., less than) a second work function of the second gate electrode region 116. In some embodiments, the first composition of one or more materials may comprise an n-type gate metal such as aluminum, tantalum, titanium, hafnium, tantalum nitride, or the like. In various embodiments, the first composition of one or more materials may be formed by way of a vapor deposition technique (e.g., PVD, CVD, PE-CVD, ALD, etc.).

Figure 17:
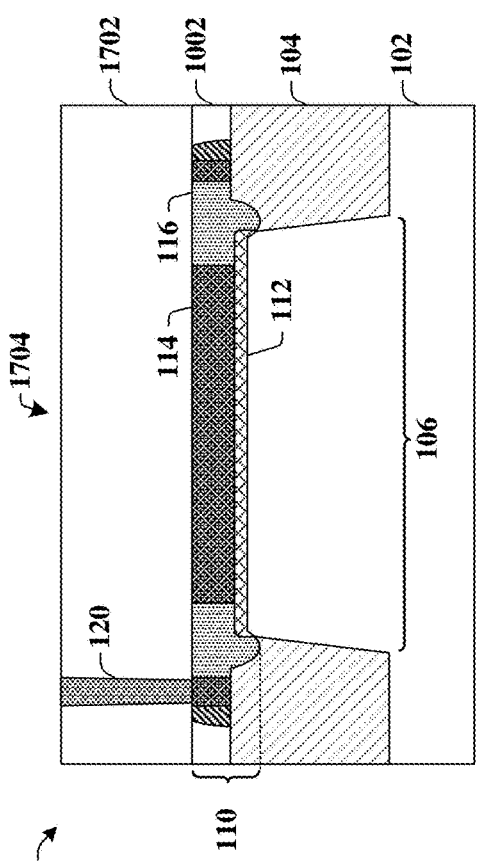

As shown in cross-sectional view 1700 of FIG. 17, a second dielectric layer 1702 (e.g., a second ILD layer) is formed over the first dielectric layer 1002 and the gate structure 110. A conductive contact 120 is formed within the second dielectric layer 1702. The conductive contact 120 extends from a top surface of the second dielectric layer 1702 to the gate structure 110. In some embodiments, the conductive contact 120 may be formed by selectively etching the second dielectric layer 1702 to form an opening 1704. The opening 1704 is subsequently filled with a conductive material to form the conductive contact 120. A planarization process (e.g., a chemical mechanical polishing process) may be performed after forming the conductive material to co-planarize upper surfaces of the second dielectric layer 1702 and the conductive contact 120. In various embodiments, the conductive material may comprise tungsten, copper, aluminum copper, or some other conductive material.

Figure 18:
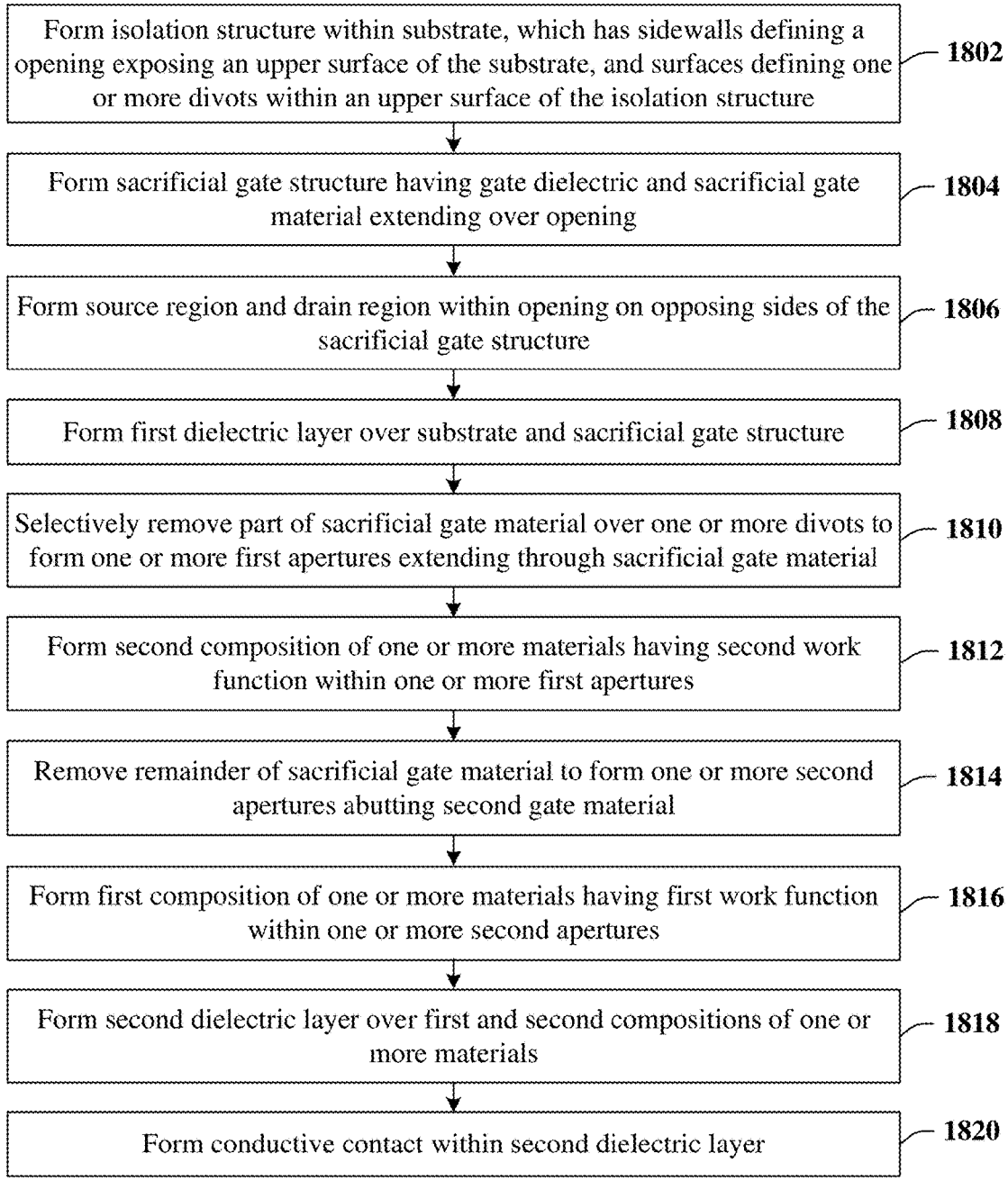
FIG. 18 illustrates a flow diagram of some embodiments of a method of forming an integrated chip having a transistor device comprising a gate structure configured to improved device performance.

FIG. 18 illustrates a flow diagram of some embodiments of a method 1800 of forming an integrated chip having a transistor device comprising a gate structure configured to improved device performance.

While the disclosed methods (e.g., methods 1800 and 2900) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1802, an isolation structure is formed within a substrate. The isolation structure comprises sidewalls defining an opening exposing an upper surface of the substrate and surfaces defining one or more divots within an upper surface of the isolation structure. FIGS. 6A-6B illustrate some embodiments corresponding to act 1802.

At 1804, a sacrificial gate structure having a gate dielectric and a sacrificial gate material is formed that extends over the opening. FIGS. 7A-8B illustrate some embodiments corresponding to act 1804.

At 1806, source and drain regions are formed within the opening on opposing sides of the sacrificial gate structure. FIGS. 9A-9B illustrate some embodiments corresponding to act 1806.

At 1808, a first dielectric layer is formed over the substrate and over the sacrificial gate structure. FIGS. 10A-11B illustrate some embodiments corresponding to act 1808.

At 1810, a part of the sacrificial gate material over the one or more divots is removed to form one or more first apertures extending through the sacrificial gate material. FIGS. 12A-13B illustrate some embodiments corresponding to act 1810.

At 1812, a second composition of one or more materials is formed within the one or more first apertures. The second composition of one or more materials define one or more second gate electrode regions having a second work function. FIGS. 14A-14B illustrate some embodiments corresponding to act 1812.

At 1814, a remainder of the sacrificial gate material is removed to form one or more second apertures abutting the second gate electrode region. FIGS. 15A-15B illustrate some embodiments corresponding to act 1814.

At 1816, a first composition of one or more materials is formed within one or more second apertures in place of the remainder of the sacrificial gate material. The first composition of one or more materials define one or more first gate electrode regions having a first work function that is different than (e.g., less than) the second work function. FIGS. 16A-16B illustrate some embodiments corresponding to act 1816.

At 1818, a second dielectric layer is formed over the first and second compositions of one or more materials. FIG. 17 illustrate some embodiments corresponding to act 1818.

At 1820, a conductive contact is formed within a second dielectric layer. FIG. 17 illustrate some embodiments corresponding to act 1820.

FIGS. 19A-28 illustrate cross-sectional views and top-views corresponding to some alternative embodiments of a method of forming an integrated chip having a transistor device comprising a gate structure configured to improved device performance. Although FIGS. 19A-28 are described with reference to a method, it will be appreciated that the structures shown in FIGS. 19A-28 are not limited to the method but rather may stand alone separate of the method.

Figure 19B:
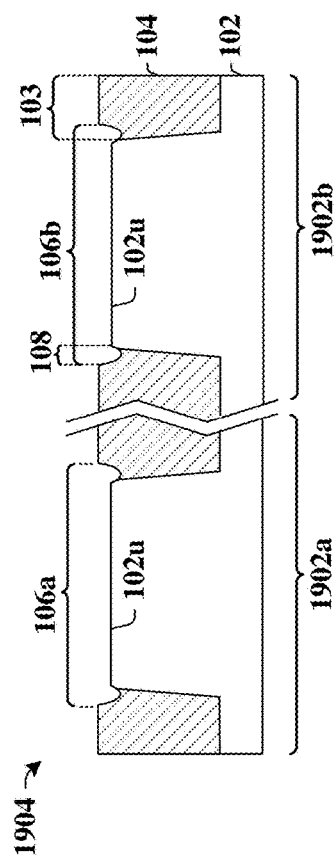
Figure 19A:
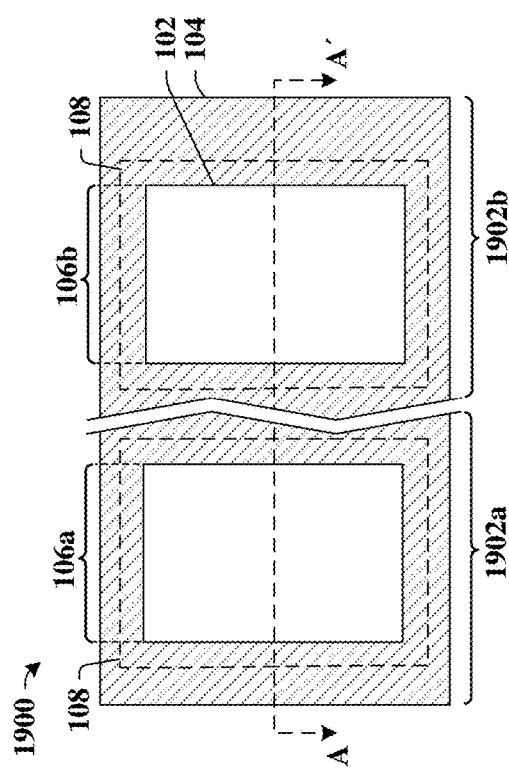

As shown in top-view 1900 of FIG. 19A and cross-sectional view 1904 of FIG. 19B, an isolation structure 104 is formed within a trench 103 within a substrate 102. The isolation structure 104 defines a first opening 106a within a first region 1902a corresponding to a first transistor type (e.g., an NMOS transistor) and a second opening 106b within a second region 1902b corresponding to a second transistor type (e.g., a PMOS transistor). The first opening 106a and the second opening 106b expose upper surfaces 102u of the substrate 102. The isolation structure 104 is arranged within a trench 103 defined by interior surfaces of the substrate 102. During formation of the isolation structure 104, one or more divots 108 may be formed within the isolation structure 104. The one or more divots 108 are recessed below a top of the isolation structure 104. The one or more divots 108 may be arranged along edges of the isolation structure 104 that are proximate to the first opening 106a and the second opening 106b.

Figure 20B:
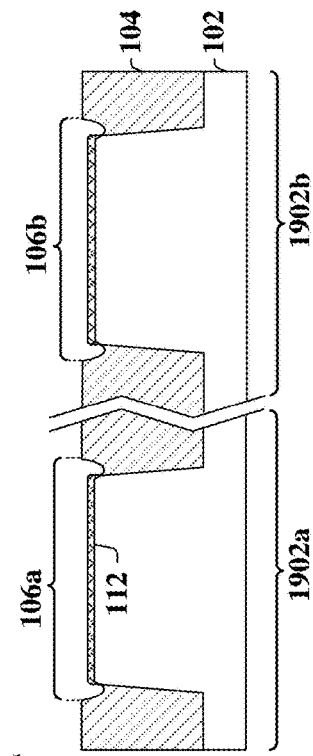
Figure 20A:
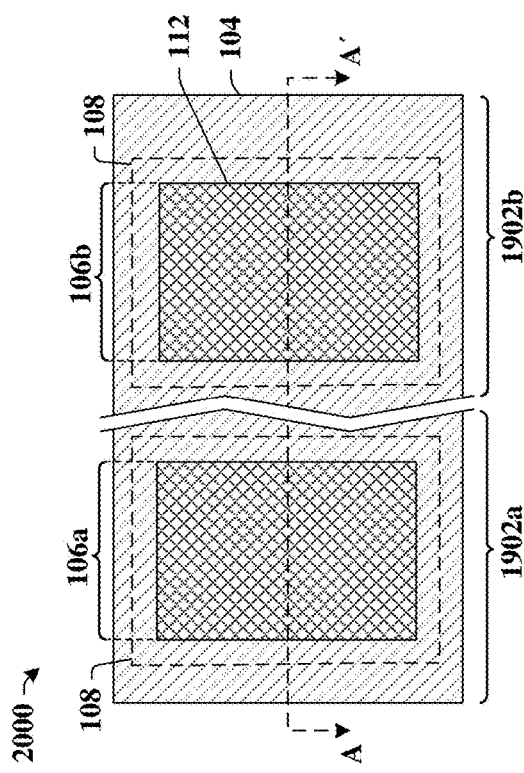

As shown in top-view 2000 of FIG. 20A and cross-sectional view 2002 of FIG. 20B, a gate dielectric 112 is formed over the substrate 102 and within the first opening 106a and the second opening 106b.

As shown in top-view 2100 of FIG. 21A and cross-sectional view 2102 of FIG. 21B, a sacrificial gate material 802 is formed over the gate dielectric 112 and over the isolation structure 104. The sacrificial gate material 802 is patterned to define sacrificial gate structures. In some embodiments, sidewall spacers 302 may be formed along sides of the sacrificial gate structures.

A first source region 124a and a first drain region 126a are formed within the substrate 102 on opposing sides of the sacrificial gate material 802 within the first opening 106a. A second source region 124b and a second drain region 126b are formed within the substrate 102 on opposing sides of the sacrificial gate material 802 within the second opening 106b. In some embodiments, the first source region 124a and the first drain region 126a may be formed by a first implantation process, while the second source region 124b and the second drain region 126b may be formed by a second implantation process. For example, the first implantation process may be performed by selectively implanting a first dopant species (e.g., comprising an n-type dopant, such as phosphorus, arsenic, etc.) into the substrate 102 according to a first mask covering the second region 1902b. Similarly, the second implantation process may be performed by selectively implanting a second dopant species (e.g., comprising a p-type dopant, such as boron, gallium, etc.) into the substrate 102 according to a second mask covering the first region 1902a.

As shown in cross-sectional view 2200 of FIG. 22, a first dielectric layer 1002 (e.g., a first inter-level dielectric (ILD) layer) is formed over the substrate 102. The first dielectric layer 1002 covers the sacrificial gate material 802 and the sidewall spacers 302. A planarization process is performed (along line 2202) to remove the first dielectric layer 1002 from over sacrificial gate material 802 and the sidewall spacers 302.

Figure 23:
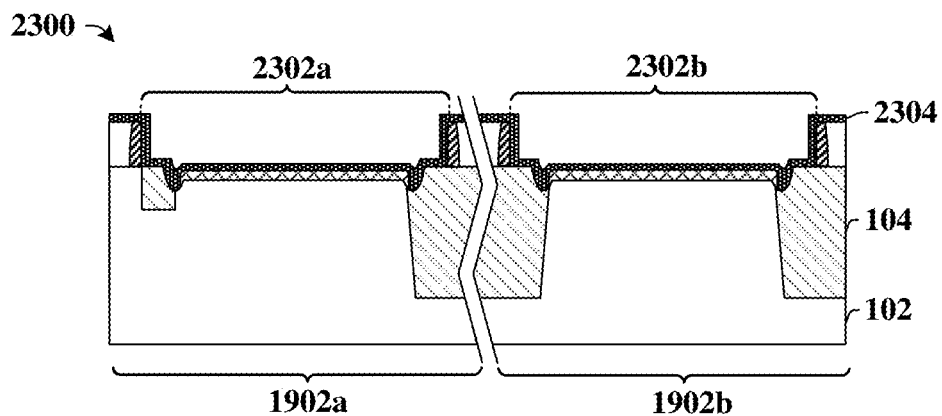

As shown in cross-sectional view 2300 of FIG. 23, the sacrificial gate material (802 of FIG. 22) within the sacrificial gate structures is removed. Removal of the sacrificial gate material results in the formation of replacement gate cavities 2302a-2302b between the sidewall spacers 302. A first gate metal 2304 is formed within the replacement gate cavities 2302a-2302b. In various embodiments, first gate metal 2304 may comprise a p-type gate metal such as nickel, cobalt, molybdenum, platinum, lead, gold, tantalum nitride, molybdenum silicide, ruthenium, chromium, tungsten, copper, or the like. In various embodiments, the first gate metal 2304 may be formed by way of a vapor deposition technique (e.g., PVD, CVD, PE-CVD, ALD, etc.).

Figure 24:
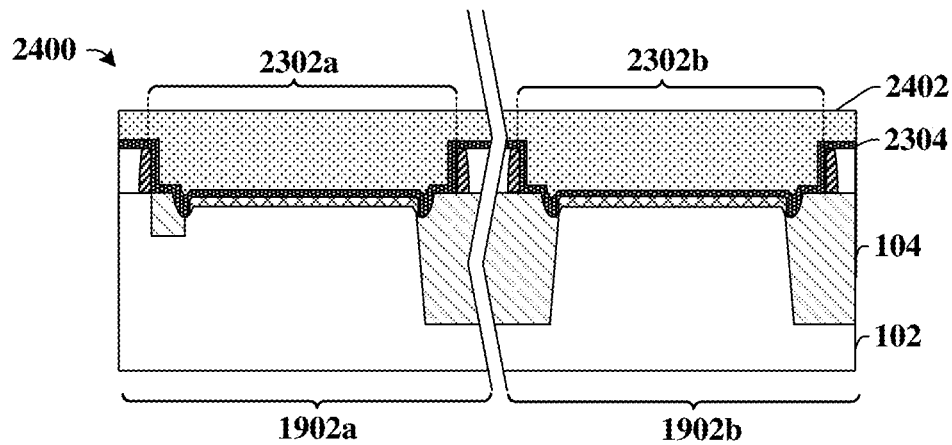

As shown in cross-sectional view 2400 of FIG. 24, a sacrificial dielectric material 2402 is formed over the first gate metal 2304 to fill the replacement gate cavities 2302a-2302b. In some embodiment, the sacrificial dielectric material 2402 may comprise a spin-on-glass (SOG).

Figure 25:
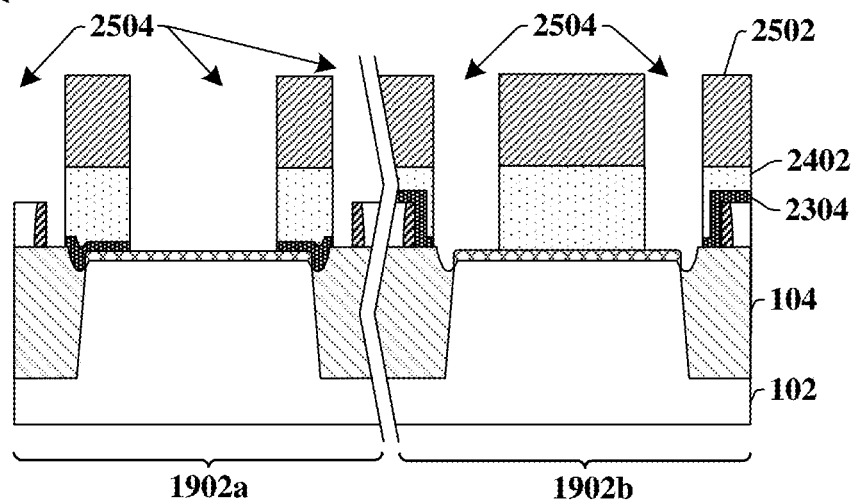

As shown in cross-sectional view 2500 of FIG. 25, a masking layer comprising a photosensitive material 2502 is formed over the sacrificial dielectric material 2402. The photosensitive material 2502 is patterned to define openings 2504 within the photosensitive material 2502. The first gate metal 2304 is selectively exposed to an etchant according to the photosensitive material 2502, so as to remove parts of the first gate metal 2304 that underlie the openings 2504 within the photosensitive material 2502. The sacrificial dielectric material 2402 remains over the divots 108 within the first region 1902a, while the sacrificial dielectric material 2402 is removed over the divots 108 within the second region 1902b. After etching first gate metal 2304, a remainder of the photosensitive material 2502 and the sacrificial dielectric material 2402 is removed.

Figure 26:
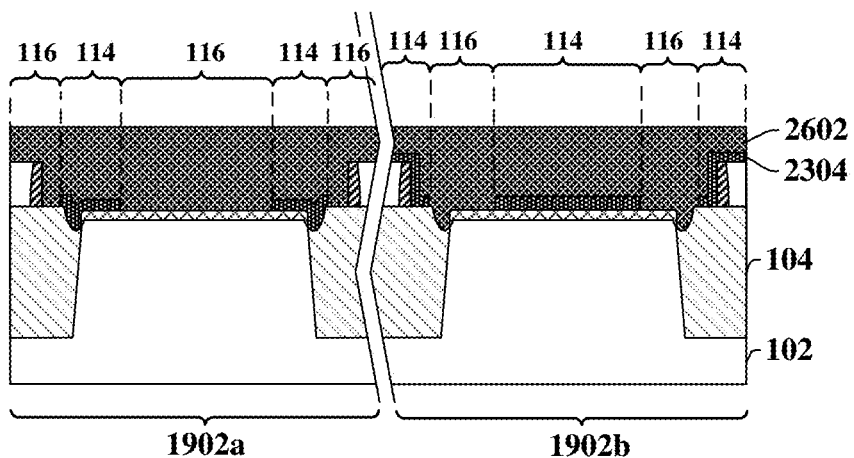

As shown in cross-sectional view 2600 of FIG. 26, a second gate metal 2602 is formed within the replacement gate cavities 2302a-2302b over the first gate metal 2304. The second gate metal 2602 has a different work function than the first gate metal 2304. The second gate metal 2602 defines a first gate electrode region 114 having a first work function and a second gate electrode region 116 having a second work function that is different than (e.g., higher than) the first work function. In the first region 1902a the first gate electrode region 114 is arranged over the one or more divots 108, while in the second region 1902b the second gate electrode region 116 is arranged over the one or more divots 108. In some embodiments, the second gate metal 2602 may comprise an n-type gate metal such as aluminum, tantalum, titanium, hafnium, zirconium, titanium silicide, tantalum nitride, tantalum silicon nitride, chromium, tungsten, cooper, titanium aluminum, or the like. In various embodiments, the second gate metal 2602 may be formed by way of a vapor deposition technique (e.g., PVD, CVD, PE-CVD, ALD, etc.).

Figure 27:
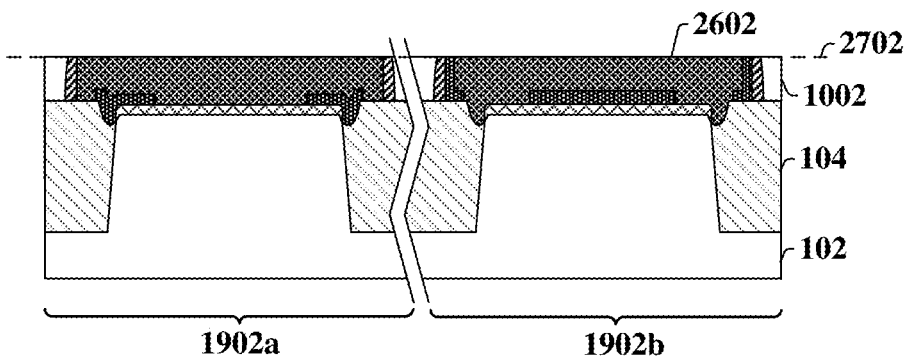

As shown in cross-sectional view 2700 of FIG. 27, a planarization process is performed (along line 2702) onto the second gate metal 2602 to remove excess of the second gate metal 2602 from over the first dielectric layer 1002.

Figure 28:
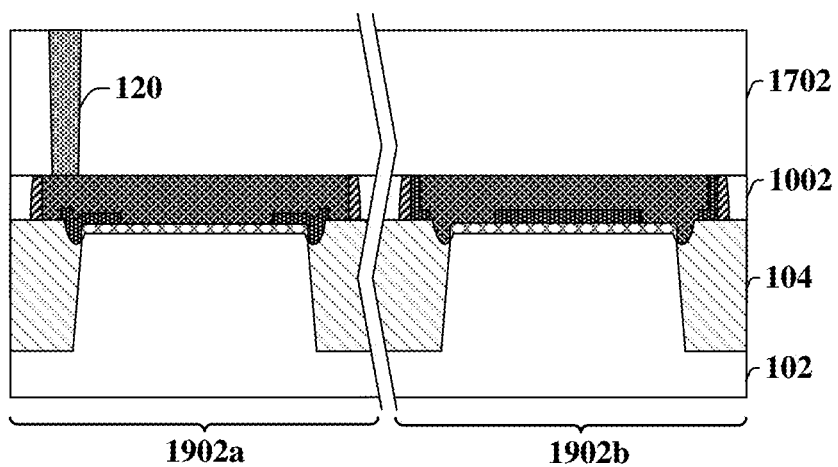

As shown in cross-sectional view 2800 of FIG. 28, a second dielectric layer 1702 (e.g., a second ILD layer) is formed over the first dielectric layer 1002 and the gate structure 110. A conductive contact 120 is formed within the second dielectric layer 1702.

Figure 29:
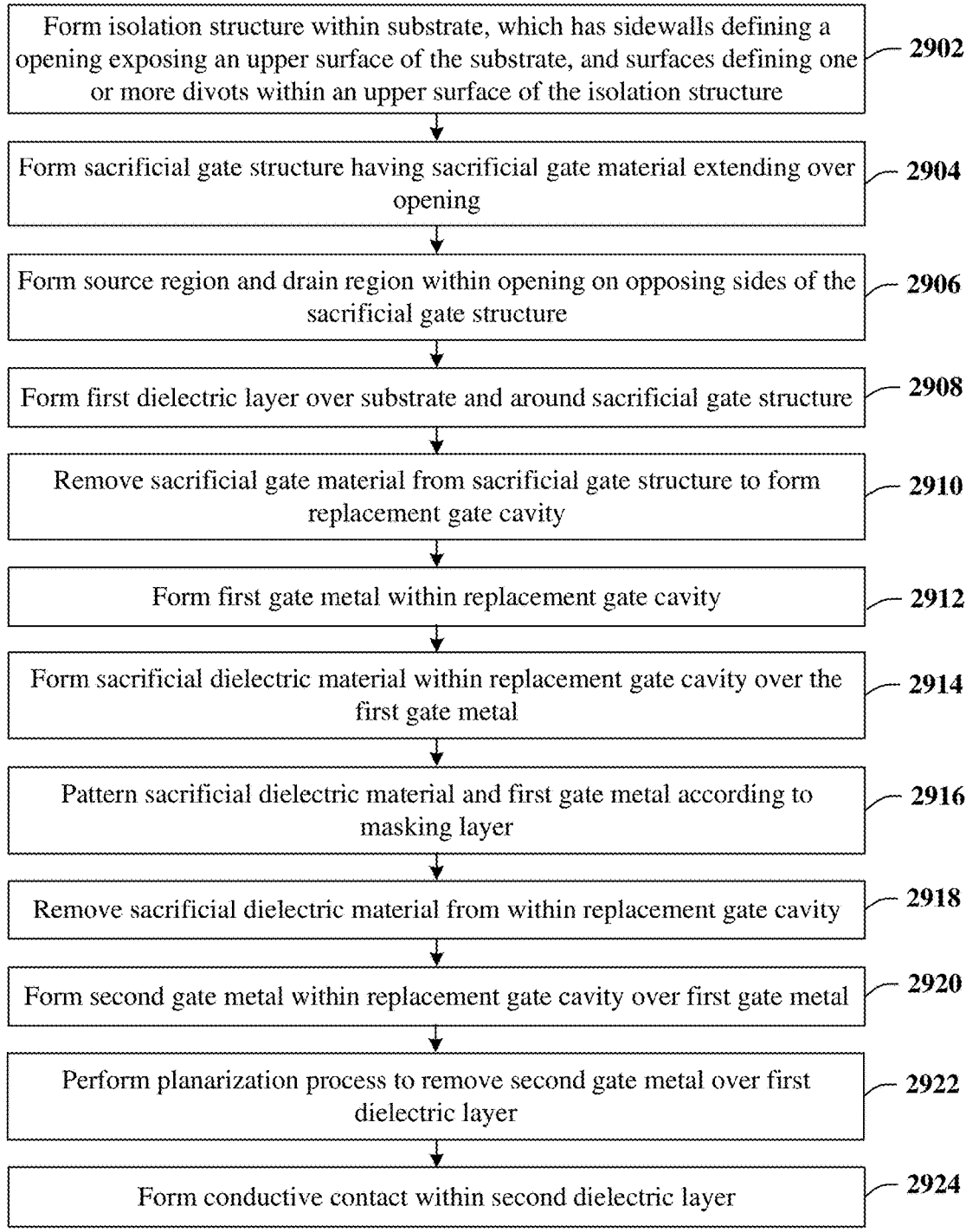
FIG. 29 illustrates a flow diagram of some alternative embodiments of a method of forming an integrated chip having a transistor device comprising a gate structure configured to improved device performance.

FIG. 29 illustrates a flow diagram of some alternative embodiments of a method 2900 of forming an integrated chip having a transistor device comprising a gate structure configured to improved device performance.

At 2902, an isolation structure is formed within a substrate. The isolation structure comprises sidewalls defining an opening exposing an upper surface of the substrate and surfaces defining one or more divots within an upper surface of the isolation structure. FIGS. 19A-19B illustrate some embodiments corresponding to act 2902.

At 2904, a sacrificial gate structure having a sacrificial gate material is formed over the opening. FIGS. 20A-21B illustrate some embodiments corresponding to act 2904.

At 2906, source and drain regions are formed within the opening on opposing sides of the sacrificial gate structure. FIGS. 21A-21B illustrate some embodiments corresponding to act 2906.

At 2908, a first dielectric layer is formed over the substrate and around the sacrificial gate structure. FIG. 22 illustrates some embodiments corresponding to act 2908.

At 2910, the sacrificial gate material is removed from within the sacrificial gate structure to form a replacement gate cavity. FIG. 23 illustrates some embodiments corresponding to act 2910.

At 2912, a first gate metal is formed within the replacement gate cavity. FIG. 23 illustrates some embodiments corresponding to act 2912.

At 2914, a sacrificial dielectric material is formed within the replacement gate cavity over the first gate metal. FIG. 24 illustrates some embodiments corresponding to act 2914.

At 2916, the sacrificial dielectric material and the first gate metal are patterned according to a masking layer. FIG. 25 illustrates some embodiments corresponding to act 2916.

At 2918, the sacrificial dielectric material is removed from within the replacement gate cavity. FIG. 26 illustrates some embodiments corresponding to act 2918.

At 2920, a second gate metal is formed within the replacement gate cavity over the first gate metal. FIG. 26 illustrates some embodiments corresponding to act 2920.

At 2922, a planarization process is performed to remove the second gate metal from over the first dielectric layer. FIG. 27 illustrates some embodiments corresponding to act 2922.

At 2924, a conductive contact is formed within a second dielectric layer over the first dielectric layer. FIG. 28 illustrates some embodiments corresponding to act 2924.

Accordingly, in some embodiments, the present disclosure relates to a transistor device having a gate structure comprising multiple gate electrode regions having different work functions configured to reduce a susceptibility of the transistor device to the kink effect, and an associated method of formation.

In some embodiments, the present disclosure relates to an integrated chip. The integrated chip, includes an isolation structure arranged within a substrate and having interior surfaces defining one or more divots recessed below an uppermost surface of the isolation structure and sidewalls defining an opening exposing the substrate; a source region disposed within the opening; a drain region disposed within the opening and separated from the source region by a channel region along a first direction; and a gate structure extending over the channel region, the gate structure includes a first gate electrode region having a first composition of one or more materials and a second gate electrode region disposed over the one or more divots and having a second composition of one or more materials different than the first composition of one or more materials. In some embodiments, the first composition of one or more materials includes an n-type gate metal, and the second composition of one or more materials includes a p-type gate metal. In some embodiments, the first composition of one or more materials has a first work function, and the second composition of one or more materials has a second work function that is greater than the first work function. In some embodiments, the first gate electrode region continuously surrounds the second gate electrode region. In some embodiments, the first gate electrode region laterally abuts the second gate electrode region along the first direction and along a second direction perpendicular to the first direction. In some embodiments, the second gate electrode region extends past the channel region in a second direction perpendicular to the first direction. In some embodiments, the channel region extends past opposing sides of the second gate electrode region in the first direction. In some embodiments, the gate structure is configured to cause the channel region to form at a lower threshold voltage along edges of the channel region than in a center of the channel region; the center of the channel region is between the edges of the channel region along a second direction perpendicular to the first direction. In some embodiments, the second composition of one or more materials vertically extends to below a bottommost surface of the first composition of one or more materials. In some embodiments, the second composition of one or more materials directly contacts the interior surfaces defining the one or more divots. In some embodiments, the gate structure further includes a gate dielectric separating the first composition of one or more materials from the substrate, the second composition of one or more materials extends from within the one or more divots to over the uppermost surface of the isolation structure and over the gate dielectric.

In other embodiments, the present disclosure relates to an integrated chip. The integrated chip includes an isolation structure having one or more dielectric materials within a trench in a substrate, interior surfaces of the isolation structure define one or more divots recessed below an uppermost surface of the isolation structure; a source region disposed within the substrate; a drain region disposed within the substrate and separated from the source region along a first direction; and a gate structure disposed over the substrate and between the source region and the drain region, the gate structure includes a first gate electrode region separated from the substrate by a gate dielectric and having a first work function; and a second gate electrode region extending from within the one or more divots to over the uppermost surface of the isolation structure and over the gate dielectric, the second gate electrode region has a second work function that is different than the first work function. In some embodiments, the first gate electrode region includes an n-type gate metal, and the second gate electrode region includes a p-type gate metal. In some embodiments, the first gate electrode region laterally contacts the second gate electrode region along the first direction and along a second direction perpendicular to the first direction. In some embodiments, the source region is separated from the drain region by a channel region; and the second gate electrode region has a first segment over a first edge of the channel region and a separate second segment over an opposing second edge of the channel region. In some embodiments, the channel region extends past opposing sides of the first segment and the second segment in the first direction.

In yet other embodiments, the present disclosure relates to a method of forming an integrated chip. The method includes depositing a sacrificial gate material over isolation structures within a substrate, wherein the isolation structures have interior surfaces defining one or more divots recessed below an uppermost surface of the isolation structures; removing a first part of the sacrificial gate material from directly over the one or more divots to form first apertures extending through the sacrificial gate material; depositing a first composition of one or more materials having a first work function within the first apertures; removing a second part of the sacrificial gate material between sidewalls of the first composition of the one or more materials; and depositing a second composition of one or more materials between the sidewalls of the first composition of the one or more materials, the second composition of one or more materials having a second work function that is different than the first work function. In some embodiments, the first composition of one or more materials consists of a p-type gate metal, and the second composition of one or more materials consists of an n-type gate metal. In some embodiments, the first composition of one or more materials and the second composition of one or more materials collectively form a gate structure. In some embodiments, a source region is formed along a first side of the gate structure, and a drain region is formed along a second side of the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
   a source region and a drain region disposed within an upper surface of a substrate;
   one or more dielectric materials disposed within a trench within the substrate, the trench surrounding the source region and the drain region, wherein the one or more dielectric materials comprise one or more interior surfaces defining a recess within the one or more dielectric materials; and
   a gate structure disposed over the substrate between the source region and the drain region, the gate structure comprising a first gate metal having a first sidewall over the upper surface of the substrate and a second gate metal having a first outer sidewall directly over the upper surface of the substrate, wherein a top surface of the second gate metal continuously extends past opposing sides of the recess.

2. The integrated chip of claim 1, wherein upper surfaces of the first gate metal and the second gate metal are substantially co-planar.

3. The integrated chip of claim 1, wherein the second gate metal extends from vertically below the first gate metal to a top of the first gate metal.

4. The integrated chip of claim 1, wherein the second gate metal completely fills the recess as viewed along a cross-sectional view.

5. The integrated chip of claim 1, wherein the first gate metal is completely laterally outside of the second gate metal.

6. The integrated chip of claim 1, wherein the first gate metal continuously extends past opposing sides of the second gate metal along a first direction and along a second direction that is perpendicular to the first direction.

7. The integrated chip of claim 1, wherein the first sidewall of the first gate metal contacts the first outer sidewall of the second gate metal directly over the upper surface of the substrate.

8. An integrated chip, comprising:
   a source region and a drain region disposed within a substrate;
   an isolation structure comprising one or more dielectric materials surrounding the source region and the drain region; and
   a gate structure disposed over the substrate between the source region and the drain region and comprising a first gate material and a second gate material, wherein the first gate material continuously extends in a closed loop around the second gate material as viewed in a top-view of the gate structure, wherein both the first gate material and the second gate material extend to directly over the isolation structure.

9. The integrated chip of claim 8, wherein the second gate material has outer sidewalls defining a rectangular shaped structure as viewed in the top-view of the gate structure.

10. The integrated chip of claim 8, further comprising:
    a dielectric layer disposed over the gate structure and having a lower surface that is in contact with both the first gate material and the second gate material.

11. The integrated chip of claim 8, further comprising:
    one or more sidewall spacers arranged along opposing sides of the gate structure, wherein the first gate material laterally separates the one or more sidewall spacers from the second gate material.

12. The integrated chip of claim 8, further comprising:
    a contact etch stop layer arranged along opposing sides of the gate structure, wherein the first gate material laterally separates the contact etch stop layer from the second gate material along a first direction.

13. The integrated chip of claim 12, wherein the contact etch stop layer extends along a second direction from over the source region to within one or more divots within the isolation structure, wherein the second direction is perpendicular to the first direction and is parallel to an upper surface of the substrate.

14. The integrated chip of claim 8, wherein the second gate material has a greater maximum height than the first gate material.

15. An integrated chip, comprising:
   a source region and a drain region disposed within a substrate;
   an isolation structure surrounding the source region and the drain region; and
   a gate structure disposed over the substrate between the source region and the drain region, the gate structure comprising a first gate metal vertically extending completely through the gate structure and a second gate metal laterally adjacent to the first gate metal and vertically extending completely through the gate structure to below a bottommost surface of the first gate metal.

16. The integrated chip of claim 15, further comprising:
   a dielectric material disposed over the gate structure and contacting upper surfaces of both the first gate metal and the second gate metal.

17. The integrated chip of claim 15, wherein the first gate metal contacts opposing sidewalls of the second gate metal.

18. The integrated chip of claim 15, further comprising:
   a gate dielectric disposed between the gate structure and the substrate, wherein both the first gate metal and the second gate metal contact an upper surface of the gate dielectric that faces away from the substrate.

19. The integrated chip of claim 15, wherein the second gate metal has a curved lower surface facing the isolation structure.

20. The integrated chip of claim 15, wherein the first gate metal continuously wraps around the second gate metal along a closed and unbroken path.

* * * * *